(12) United States Patent
Nagai

(10) Patent No.: US 7,629,636 B2
(45) Date of Patent: Dec. 8, 2009

(54) SEMICONDUCTOR DEVICE AND MANUFACTURING METHOD THEREOF

(75) Inventor: Kouichi Nagai, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/952,387

(22) Filed: Dec. 7, 2007

(65) Prior Publication Data

US 2008/0128858 A1 Jun. 5, 2008

Related U.S. Application Data

(63) Continuation of application No. PCT/JP2005/010554, filed on Jun. 9, 2005.

(51) Int. Cl.
H01L 29/94 (2006.01)
(52) U.S. Cl. ............... 257/295; 257/532; 257/E21.159; 257/E21.649; 257/E29.139; 257/306; 438/3; 438/240
(58) Field of Classification Search ................. 257/532, 257/295, 296; 438/244, 673
See application file for complete search history.

(56) References Cited

U.S. PATENT DOCUMENTS 6,855,565 B2 2/2005 Kanaya et al.

2004/0211997 A1* 10/2004 Oh et al. ..................... 257/295

FOREIGN PATENT DOCUMENTS

| JP | 9-22829 A | 1/1997 |
|---|---|---|
| JP | 10-50956 A | 2/1998 |
| JP | 2002-33459 A | 1/2002 |
| JP | 2003-68990 A | 3/2003 |
| JP | 2004-193175 A | 7/2004 |
| JP | 2005-72474 A | 3/2005 |

OTHER PUBLICATIONS

Translation of JP-JP patent publication No. 2002-033459. , of record.*
International Search Report of PCT/JP2005/010554, date of mailing Jul. 26, 2005.
Translation of International Preliminary Report on Patentability mailed Dec. 7, 2007 of International Application No. PCT/JP2005/010554.
Chinese Office Action dated Jun. 12, 2009, issued in corresponding Chinese Application No. 200580050076.4.

* cited by examiner

*Primary Examiner*—N Drew Richards
*Assistant Examiner*—Mamadou Diallo
(74) *Attorney, Agent, or Firm*—Westerman, Hattori, Daniels & Adrian, LLP

(57) ABSTRACT

When adopting a stack-type capacitor structure for a ferroelectric capacitor structure (30), an interlayer insulating film (27) is formed between a lower electrode (39) (or a barrier conductive film) and a conductive plug (22) to eliminate an impact of orientation/level difference on a surface of the conductive plug (22) onto the ferroelectric film (40). Differently from a conductive film like the lower electrode (39) or the barrier conductive film, the interlayer insulating film (27) can be formed without inheriting the orientation/level difference from its lower layers by planarizing the surface thereof.

10 Claims, 25 Drawing Sheets

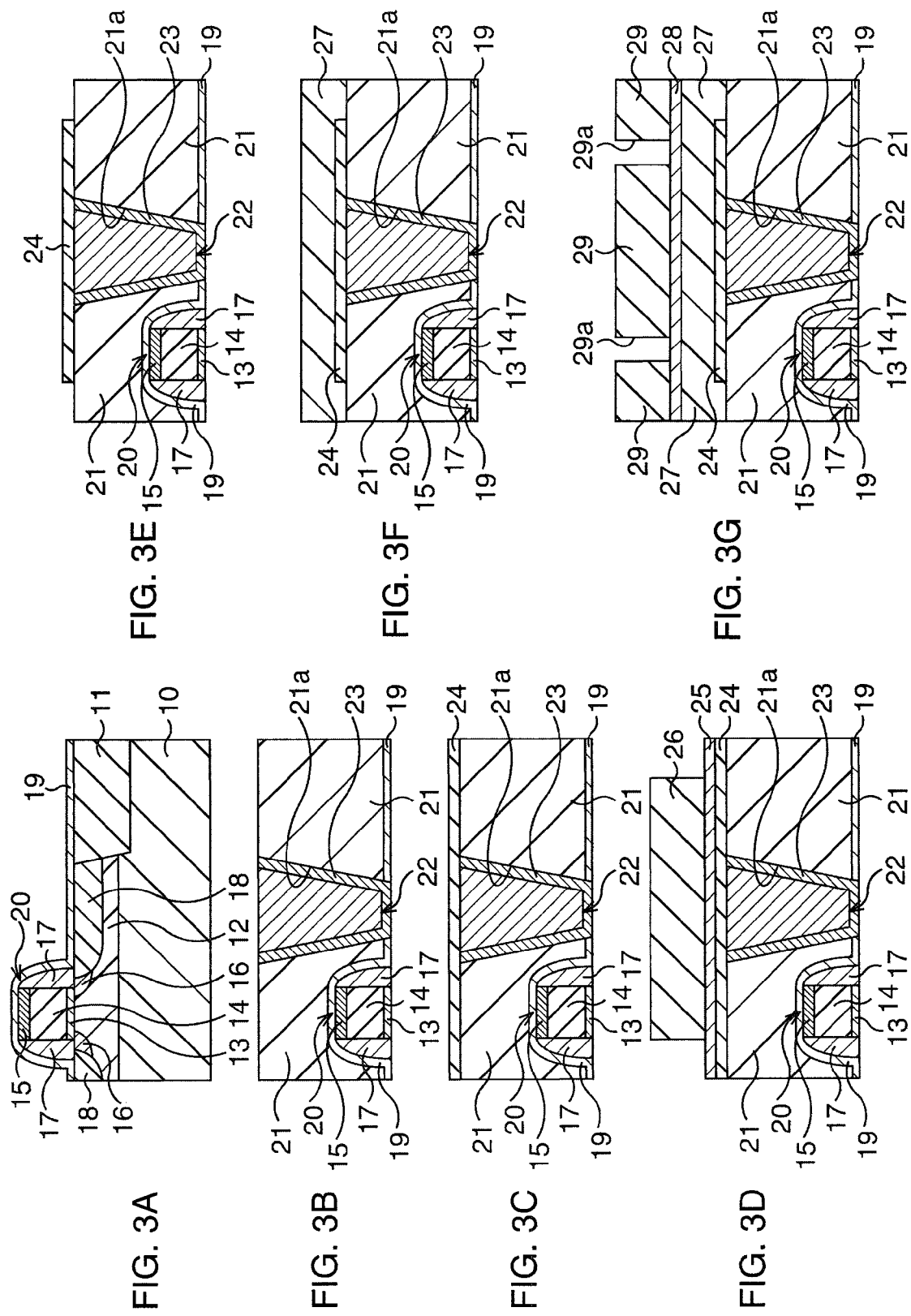

SEMICONDUCTOR DEVICE AND MANUFACTURING METHOD THEREOF

TECHNICAL FIELD

The embodiments discussed herein are directed to a semiconductor device having a ferroelectric capacitor structure formed by a lower electrode, an upper electrode and a dielectric film with ferroelectric characteristics sandwiched between the lower electrode and the upper electrode, and a manufacturing method of the same.

BACKGROUND ART

Conventionally, as a nonvolatile memory not loosing information stored therein even when a power supply is cut, a flash memory and a ferroelectric memory (FeRAM: Ferro-electric Random Access Memory) are known.

The flash memory includes a floating gate buried in a gate insulating film of an Insulated gate field effect transistor (IGFET) to store information by accumulating charges indicating information to be stored in the floating gate. For writing and deleting information, it is necessary to flow tunneling current passing through the insulating film, requiring a relatively high voltage.

FeRAM stores information using hysteresis characteristics (ferroelectric characteristics) of the ferroelectric. The ferroelectric capacitor structure having a ferroelectric film as a dielectric between a pair of electrodes generates polarization in accordance with a voltage applied between the electrodes, having spontaneous polarization even after the applied voltage is removed. When the polarity of the applied voltage is inversed, the polarity of the spontaneous polarization is inversed as well. Detection of this spontaneous polarization allows the information to be read out. As compared with the flash memory, the FeRAM operates at a lower voltage, having an advantage of allowing a high-speed writing while saving energy. A logic mixed chip (SOC: System On Chip) adopting the FeRAM for a conventional logic technology is under study for use in an IC card and the like.

At present, as a ferroelectric capacitor of a FeRAM, one adopting a so-called planer-type capacitor structure, in which a lower electrode of a capacitor and an impurity diffusion region of a transistor is eclectically connected by a drawn-out electrode provided on the lower electrode, is put into practical use. Recently, the semiconductor memories are increasingly demanded for microfabrication, and it is inevitable to reduce a memory cell area to respond to the demand. Accordingly, for a ferroelectric capacitor for a future FeRAM, an application of a so-called stack-type capacitor structure with its lower electrode being connected to the impurity diffusion region via a conductive plug to be a bulk contact immediately beneath the lower electrode is considered to be urgent.

Patent document 1: Japanese Patent Application Laid-Open No. 2002-33459
Patent document 2: Japanese Patent Application Laid-Open No. Hei10-50956.

In a stack-type ferroelectric capacitor, a lower electrode is formed in a stacked manner directly on the conductive plug (or, via a barrier conductive film formed as an oxidization preventing film of the conductive film) to connect the conductive plug and the lower electrode of the ferroelectric capacitor. In that case, the lower electrode (or the barrier conductive film, which is also applicable in the same manner hereinbelow) and those stacked thereafter inherit the impact of orientation and level difference of the conductive plug. The ferroelectric film formed on the lower electrode is strongly affected by the impact of the orientation and level difference and is thereby inevitably degraded by the impact of the conductive plug.

Particularly, tungsten (W) is frequently used as a material for the conductive plug used for the bulk contact. In a W plug, a groove-shaped recession called a seam is generated on the surface thereof to cause degasification backed by impurities accumulated in the seam, helping the ferroelectric film degrade further. Further, at the time of a surface planarization by a chemical mechanical polishing (CMP) method, a level difference generated between the surrounding insulating film is large, causing problems that the orientation of the ferroelectric film is significantly degraded and that the ferroelectric characteristics (a Q-switch characteristic and the like) are damaged.

Thus, the stack-type capacitor structure allows the reduction in the occupied area of the capacitor while assuring relatively large capacitance, and thereby the application of the structure to the ferroelectric capacitor contributes to elements in respect of the microfabrication and a density increase being demanded these days. Meanwhile, on the other side, due to the conductive plug provided as a bulk contact immediately beneath the lower electrode, the orientation of the ferroelectric film degrades significantly to damage the ferroelectric characteristics, being a serious problem left unsolved at present.

SUMMARY

It is an aspect of the embodiments discussed herein to provide a semiconductor device includes: a semiconductor substrate; a conductive plug formed above the semiconductor substrate; a capacitor structure formed at a portion aligned with above the conductive plug by sandwiching a ferroelectric film having ferroelectric characteristics between a lower electrode and an upper electrode; and an interlayer insulating film formed between the conductive plug and the capacitor structure, in which the conductive plug and the lower electrode are electrically connected at a portion other than a region corresponding to a region in the interlayer insulating film and between the conductive plug and the lower electrode.

A manufacturing method of a semiconductor device includes the steps of: forming a conductive plug above a semiconductor substrate; forming a conductive film to cover an upper surface of the conductive plug; forming an interlayer insulating film to cover the conductive film; forming a connecting portion formed by a conductive material in a buried manner in the interlayer insulating film to be electrically connected with the conductive film; and forming a capacitor structure formed by stacking the lower electrode, a dielectric film with ferroelectric characteristics and the upper electrode sequentially at a portion aligned with a portion above the conductive plug so that the lower electrode is electrically connected with the connecting portion, in which, in plan view, the connecting portion is formed at a portion other than a region corresponding to a region in the interlayer insulating film and between the conductive plug and the lower electrode and including a peripheral region of the lower electrode.

BRIEF DESCRIPTION OF THE DRAWINGS

FIG. 3A is a schematic sectional view showing a manufacturing method of a FeRAM according to a first embodiment in the order of steps;

FIG. 3B is a schematic sectional view showing the manufacturing method of the FeRAM according to the first embodiment in the order of the steps;

FIG. 3C is a schematic sectional view showing the manufacturing method of the FeRAM according to the first embodiment in the order of the steps;

FIG. 3D is a schematic sectional view showing the manufacturing method of the FeRAM according to the first embodiment in the order of the steps;

FIG. 3E is a schematic sectional view showing the manufacturing method of the FeRAM according to the first embodiment in the order of the steps;

FIG. 3F is a schematic sectional view showing the manufacturing method of the FeRAM according to the first embodiment in the order of the steps;

FIG. 3G is a schematic sectional view showing the manufacturing method of the FeRAM according to the first embodiment in the order of the steps;

DETAILED DESCRIPTION OF THE PREFERRED EMBODIMENTS

Basic Gist of Present Embodiment

Figure 1A:
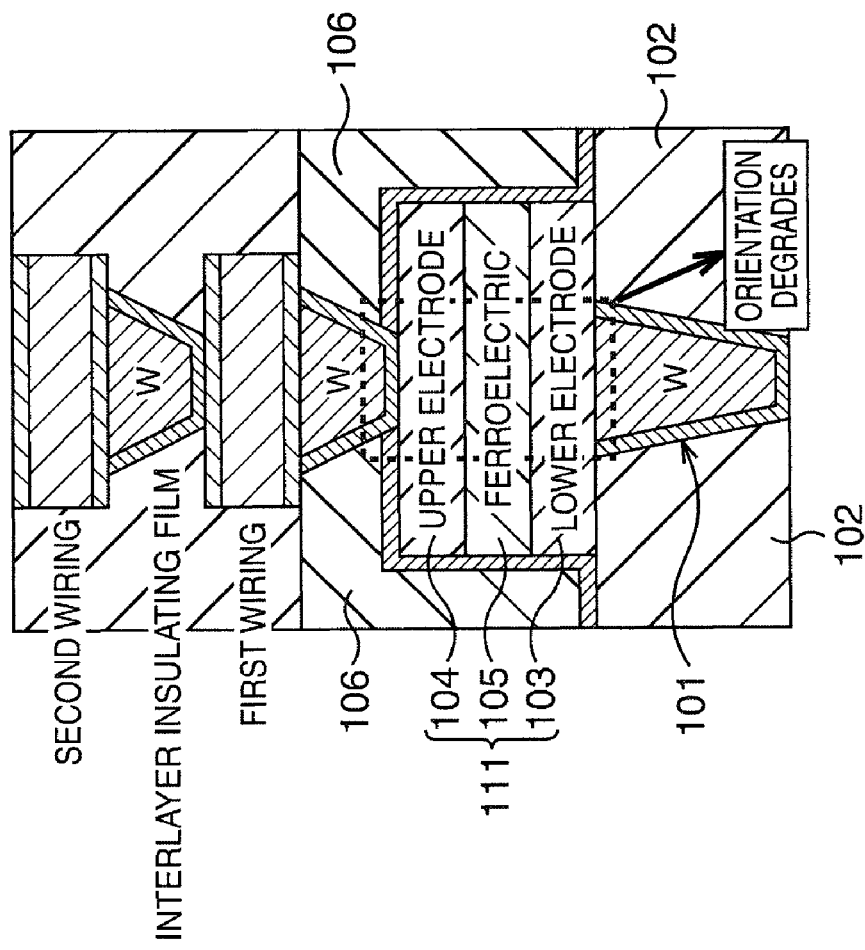
FIG. 1A is a schematic sectional view showing an appearance in the vicinity of a stack-type ferroelectric capacitor of a conventional FeRAM.

In the present embodiment, when adopting a stack-type capacitor structure for a ferroelectric capacitor, an interlayer insulating film is formed between a lower electrode (or a barrier conductive film) and a conductive plug to eliminate the impact of orientation/level difference of the surface of the conductive plug onto the ferroelectric film. Differently from the conductive film like the lower electrode or the barrier conductive film, the interlayer insulating film can be formed without inheriting the orientation/level difference from its lower layer by planarizing the surface thereof.

In the present embodiment, in order to assure the orientation of the lower electrode and further the orientation of the central region of the ferroelectric film to be favorable, the region corresponding to between the conductive plug and the lower electrode in the interlayer insulating film in plan view, namely in the portion other than the central region, the conductive plug and the lower electrode are electrically connected. In detail, the conductive film is formed to cover the upper surface of the conductive plug, and the connecting portion electrically connecting the conductive plug and the lower electrode via the conductive film is formed at such a portion in the interlayer insulating film covering the conductive film that includes the peripheral region of the lower electrode.

In a FeRAM, after the ferroelectric capacitor is formed, an annealing process is needed to recover characteristics of the ferroelectric film, however, caused by the annealing process, Pb and oxygen depart from the peripheral region of the ferroelectric film (for example, in the case where the film is formed by PZT and the like) to lower the concentration levels of Pb and oxygen in the peripheral region. Due to this departure of Pb and oxygen, in the peripheral region of the ferroelectric film, the ferroelectric characteristics thereof inevitably degrade.

Similarly, in the present embodiment, the connecting portion connecting the conductive plug and the lower electrode is necessary, and the ferroelectric characteristics of the ferroelectric film inevitably degrade at the position of the lower electrode where the connecting portion is formed. In the present embodiment, by taking advantage of the peripheral region in the ferroelectric film, in which the ferroelectric characteristics inevitably degrade, the connecting portion is provided at such a portion of the lower electrode that corresponds to the peripheral portion. Specifically, the connecting portion is formed in the peripheral region inevitably degrade by nature, and no structure evoking the degradation of the orientation of the ferroelectric film is provided in the central region of the lower electrode. In the present structure, in the central region of the ferroelectric film being most effective to ensure the ferroelectric characteristics, the impact of the conductive plug is blocked by the interlayer insulating film, so that those stacked on the interlayer insulating film can be formed with their orientation being controlled to be favorable. Accordingly, the ferroelectric film can be formed to have an orientation being as excellent as possible and ferroelectric characteristics being as high as possible.

In this regard, in Patent document 1, there is disclosed an example in which a recessed portion of a frame shape is formed in a barrier conductive film on a lower electrode. However, as long as the barrier conductive film is formed immediately on the conductive plug, those stacked thereon and thereabove inevitably inherit the impact of the orientation/level difference of the conductive plug.

Further, in Patent document 2, there is disclosed an example in which a lower electrode is formed in a buried manner in a stacked film of a silicon oxide film and a silicon nitride film via a barrier conductive film. As in Patent document 1, as long as the barrier conductive film is formed immediately on the conductive plug, those stacked thereon and thereabove is forced to inherit the impact of the orientation/level difference of the conductive plug.

A concrete example of the present embodiment will be described based on the comparison with a conventional example.

Figure 2A:
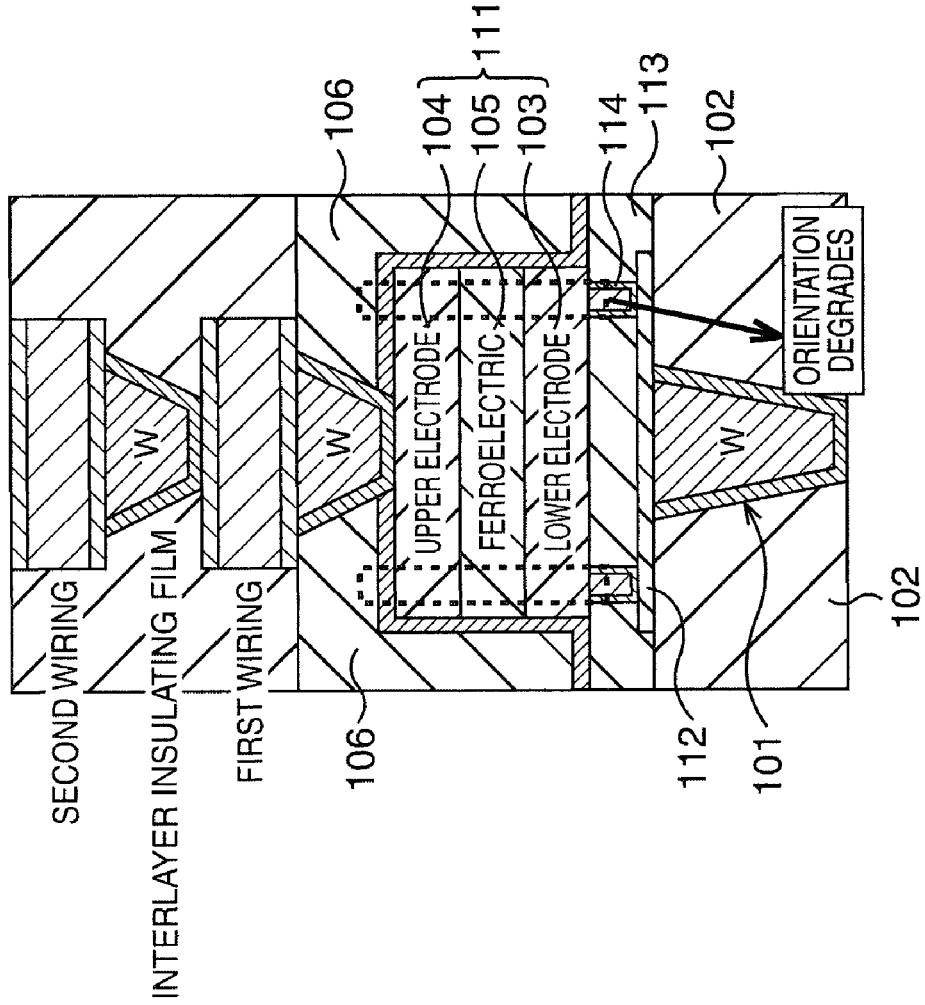
FIG. 2A is a schematic sectional view showing an appearance in the vicinity of a stack-type ferroelectric capacitor of a FeRAM.

FIG. 1A, FIG. 2A are schematic sectional views showing appearances in the vicinity of a stacked-type ferroelectric capacitor of a FeRAM, in which FIG. 1A is the conventional example and FIG. 2A is an example of the present embodiment.

In both FIG. 1A and FIG. 2A, a W plug 101 to be a bulk contact is formed in a buried manner in an interlayer insulating film 102, and a ferroelectric capacitor 111 formed by sandwiching a ferroelectric film 105 by a lower electrode 103 and an upper electrode 104 is formed in a buried manner in an interlayer insulating film 106.

Figure 1B:
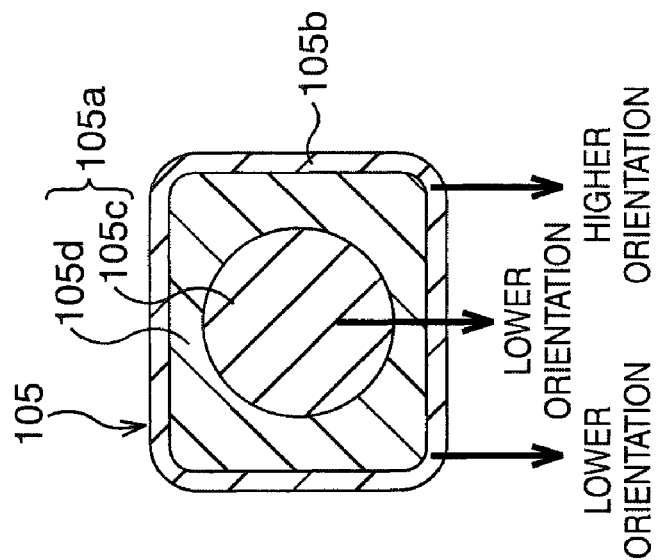
FIG. 1B is a schematic plan view schematically showing an orientation of a ferroelectric film of a conventional ferroelectric capacitor.

In the conventional stack-type ferroelectric capacitor, as shown in FIG. 1A, the lower electrode 103 is formed directly on the W plug 101 so that the lower electrode 103 is connected to the W plug 101, and the ferroelectric film 105 and the upper electrode 104 are formed in a stacked manner on the lower electrode 103 sequentially. Accordingly, the lower electrode 103 inherits the impact of the orientation/level difference of the W plug 101, and further, the ferroelectric film 105 inherits the impact similarly. The appearance of the ferroelectric film 105 at this time is shown in plan view in FIG. 1B. Thus, in the conventional structure, of the ferroelectric film 105, a central portion 105c of a central region 105a (shown by a broken line in FIG. 1A) and a peripheral region 105b exhibit a low orientation, and that exhibits an orientation higher than that is only an interstitial portion 105d being the central region 105a except the central portion 105c.

On the other hand, in the stack-type ferroelectric capacitor according to the present embodiment, as shown in FIG. 2A, a conductive film 112 is formed to cover the W plug 101 and an interlayer insulating film 113 is formed to cover the conductive film 112. The surface of the interlayer insulating film 113 is planarized. The lower electrode 103 is formed on the W plug 101 via the interlayer insulating film 113, and the ferroelectric film 105 and the upper electrode 104 are formed sequentially on the lower electrode 103. The W plug 101 and the lower electrode 103 are electrically connected by connecting the conductive film 112 and the lower electrode 103 with a connecting portion 114 formed in a buried manner in a portion corresponding to the peripheral region 105b of the ferroelectric film 105 in the interlayer insulating film 113.

Figure 2B:
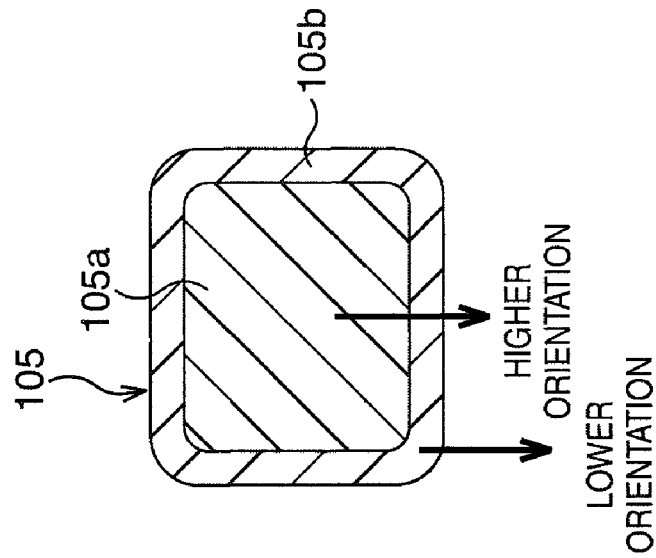
FIG. 2B is a schematic plan view schematically showing an orientation of a ferroelectric film of a ferroelectric capacitor.

The appearance of the ferroelectric film 105 at this time is shown in plan view in FIG. 2B. Thus, in the structure according to the present embodiment, the orientation is low only in the peripheral region 105b (the region shown by a broken line in FIG. 2A) inevitably causing the orientation to degrade, so that a high orientation is realized all over the central region 105a of the ferroelectric film 105, the central region 105a being the most effective region to ensure the ferroelectric characteristics.

As a connecting portion, it is conceivable that the connecting portion is formed into a frame shape along the peripheral region of the lower electrode. By forming the connecting portion into the frame shape, the peripheral region not serving in nature to ensure the orientation is usable as much as possible, allowing the connection with the lower electrode to be obtained sufficiently, so that excellent orientation and the ferroelectric characteristics in the central region of the ferroelectric film is realized.

Further, as a connecting portion, one formed into a plug shape to be positioned at two or four corners in the peripheral region of the lower electrode is conceivable. By forming the connecting portion into the plug shape, the formation of the connection portion is relatively facilitated, and the excellent orientation and ferroelectric characteristics in the central region of the ferroelectric film can be realized.

As a specific position to form the connecting portion, a position in the peripheral region of the lower electrode is preferable. In the FeRAM, the annealing process is needed after the ferroelectric capacitor is formed for the purpose of recovering the characteristics of the ferroelectric film. When a part of the connecting portion protrudes outside the lower electrode and the connecting portion is of W and the like, the surface of the connecting portion is subject to oxidization due to the annealing process to sharply degrade the conductivity. Therefore, by forming the connecting portion at the position in the peripheral region of the lower electrode, the connecting portion can be prevented from the oxidization, so that sufficient connection can be ensured.

When forming the connecting portion at the position in the peripheral region of the lower electrode, W or copper (Cu) generally used as a material for the connecting portion can be used. When Cu is in use, a groove or an opening to be the connecting portion is buried with Cu by so-called plating method, and the surface thereof is planarized by CMP method. Differently from CVD method, no seam or the like is generated by the plating method. Therefore, no concern about degasification is caused by impurities accumulated in the seam, and the groove or the opening can be buried with high filling performance. In addition, since Cu is relatively flexible and a polishing rate thereof is close to that of the interlayer insulating film, the level difference between the interlayer insulating film is difficult to be caused. Accordingly, with the use of Cu, even a minute groove or opening can be buried sufficiently.

Further, as a specific portion to form the connecting portion and the like, a position over in and out of the lower electrode including the peripheral region of the lower electrode is conceivable. In the case where the occupied area of the ferroelectric capacitor is reduced further in plan view, it becomes difficult to form the connecting portion, above all, the connecting portion of the frame shape, in the position in the peripheral region of the lower electrode as described above. Therefore, by forming the connecting portion over in and out of the lower electrode including the peripheral region of the lower electrode as described above, it is possible to cope with a microfabrication. In that case, as a measure against the oxidization of the connecting portion, it is conceivable to reduce the temperature of the annealing process for recovering the characteristics and to select the material for the connecting portion. As a concrete example of the latter, iridium (Ir) and TiAlN can be cited. Ir is a metal not losing its conductivity even when it is oxidized to be $IrO_2$ (conductive oxide). Meanwhile, TiAlN is a conductive nitride with excellent oxidation resistance. By using these as materials for the connecting portion, the connecting portion can be formed at the position over in and out of the lower electrode including the peripheral region of the lower electrode, so that it becomes possible to cope with further microfabrication of the ferroelectric capacitor.

Specific Embodiments

Hereinafter, specific embodiments applying the present embodiment will be described in detail with reference to the drawings.

First Embodiment

In the present embodiment, a structure and a manufacturing method of a FeRAM adopting a stack-type capacitor structure will be disclosed. Note that, in the present embodiment, only the vicinity of a memory cell section of the FeRAM will be shown and the description and drawing of a logic portion thereof and the like will be omitted. Here, for convenience of description, the structure of the FeRAM will be described together with the manufacturing method thereof.

FIG. 3A to FIG. 7B are schematic sectional views showing the manufacturing method of the FeRAM according to a first embodiment in the order of steps.

First, as shown in FIG. 3A, a MOS transistor 20 serving as a selection transistor is formed on a silicon semiconductor substrate 10.

Specifically, an element isolation structure 11 is formed on a surface layer of the silicon semiconductor substrate 10, for example, by STI (Shallow Trench Isolation) method to define an element active region.

Subsequently, an impurity, for example, "B" here is ion injected into the element active region under the conditions of a dose amount of $3.0 \times 10^{13}/cm^2$ and an acceleration energy of 300 keV to thereby form a well 12.

Subsequently, a shallow gate insulating film 13 having a film thickness of about 3.0 nm is formed in the element active region by thermal oxidization and the like; a polycrystalline silicon film having a film thickness of about 180 nm and a film having a film thickness of about 29 nm, for example, a silicon nitride film are deposited on the gate insulating film 13; and the silicon nitride film, the polycrystalline silicon film and the gate insulating film 13 are processed to have an electrode shape by lithography and dry etching followed to form a gate electrode 14 on the gate insulating film 13 by patterning. At the same time of this, a cap film 15 formed by a silicon nitride film is formed on the gate electrode 14 by patterning.

Subsequently, an impurity, "As" here is ion injected into the element active region using the cap film 15 as a mask under the conditions of a dose amount of $5.0 \times 10^{14}/cm^2$ and an acceleration energy of 10 keV to thereby form a so-called LDD region 16.

Subsequently, for example, a silicon oxide film is deposited all over the surface by CDV method, and the silicon oxide film is subject to a so-called etch back to form a side wall insulating film 17 by letting the silicon oxide film remain only on the side surfaces of the gate electrode 14 and the cap film 15.

Subsequently, an impurity, here, P is ion injected into the element active region using the cap film 15 and the side wall insulating film 17 as a mask under the conditions of increasing an impurity concentration to higher than that of the LDD region 16, for example, a dose amount of $5.0 \times 10^{14}/cm^2$ and an acceleration energy of 13 keV to form a source/drain region 18 superimposed on the LDD region 16 to thereby complete a MOS transistor 20. Then, a protection film 19 is formed to cover the MOS transistor 20. As a protection film 19, a silicon oxynitride (SiON) is deposited to have a film thickness of about 200 nm. Note that, in FIG. 3B and thereafter, the silicon semiconductor substrate 10, the well 12, the element isolation structure 11, the LDD region 16 and the source/drain region 18 are omitted in the drawings.

Subsequently, as shown in FIG. 3B, an interlayer insulating film 21 covering the MOS transistor 20 and a W plug 22 to be a bulk contact are formed.

Specifically, first, the interlayer insulating film 21 is formed to cover the MOS transistor 20. Here, as an interlayer insulating film 21, a silicon oxide film is deposited to have a film thickness of about 600 nm by CVD method using, for example, TEOS. After that, the surface of the interlayer insulating film 21 is planarized, for example, by CMP method.

Subsequently, the interlayer insulating film 21 and the protection film 19 are processed to the extent that a part of the surface of the source/drain region 18 is exposed by lithography and dry etching followed to thereby form a contact hole 21a having a diameter of, for example, about 0.25 μm.

Subsequently, a base film (glue film) 23 is formed by depositing, for example, a Ti film (of a film thickness of about 30 nm) and a TiN film (of a film thickness of about 20 nm) sequentially on the interlayer insulating film 21 by sputtering method so as to cover a wall surface of the contact hole 21a.

After that, a tungsten (W) film is formed by CVD method to bury the contact hole 21a via the glue film 23. For example, by CMP, the W film and the glue film 23 are polished using the interlayer insulating film 21 as a stopper to form a W plug 22 being the contact hole 21a in which W is buried via the glue film 23.

Subsequently, as shown in FIG. 3C, a conductive film 24 is formed.

Specifically, for example, a TiN film (of a film thickness of about 150 nm), an Al—Cu film (of a film thickness of about 300 nm) and a TiN film (of a film thickness of about 150 nm) are sequentially deposited by sputtering method to form the conductive film 24 of a stacked structure. Here, considering that the TiN film is superior to the Al—Cu film in view of heat resistance, it is possible to form the TiN film to have a larger film thickness without forming the Al—Cu film. For example, in that case, the TiN film is deposited to have a film thickness of about 300 nm to 500 nm to form the conductive film 24 of a single layer structure.

Subsequently, as shown in FIG. 3D, a resist pattern 26 is formed to process the conductive film 24.

Specifically, after an anti-reflection film 25 (which is possible to be omitted) is formed on the conductive film 24 by coating, a resist is formed on the anti-reflective protection film 25 by coating. The resist is then processed by lithography to form the resist pattern 26.

Subsequently, as shown in FIG. 3E, the conductive film 24 is processed using the resist pattern 26.

Specifically, the conductive film 24 is dry etched using the resist pattern 26 as a mask. At the same time, the anti-reflection film 25 is etched as well. The conductive film 24 is patterned to cover the W plug 22 on the interlayer insulating film 21 by this dry etching in a manner following the resist pattern 26. After that, the resist pattern 26 and the anti-reflection film 25 thereunder are removed.

Subsequently, as shown in FIG. 3F, an interlayer insulating film 27 is formed.

Specifically, the interlayer insulating film 27 is formed on the interlayer insulating film 21 such that the conductive film 24 is buried therein. Here, as an interlayer insulating film 27, a silicon oxynitride film is deposited to have a film thickness of about 1300 nm to 1500 nm by CVD method using, for example, TEOS. After that, in order to remove a level difference on the surface of the interlayer insulating film 27 formed by covering the conductive film 24, the surface layer of the interlayer insulating film 27 is removed, for example, by CMP method such that the interlayer insulating film 27 has a remaining film thickness of about 300 nm to 400 nm. With this, the surface of the interlayer insulating film 27 is planarized.

Here, with the planarization of the surface of the interlayer insulating film 27 by CMP method, the impact of the orientation/level difference of the W plug 22 is not inherited by the interlayer insulating film 27 and is blocked thereby, more specifically, the interlayer insulating film 27 is formed to have excellent orientation on the surface thereof.

Subsequently, as shown in FIG. 3G, a resist pattern 29 to form a groove in the interlayer insulating film 27 is formed.

Specifically, after an anti-reflection film 28 (which is possible to be omitted) is formed on the interlayer insulating film 27 by coating, a resist is formed on the anti-reflection film 28 by coating. Then, the resist is processed by lithography to form a resist pattern 29 with a frame-shaped groove 29a aligned with the position of the peripheral region of the conductive film 24. The applicable shape other than the frame-shaped groove 29a will be described in a later-described modification example.

Figure 4A:
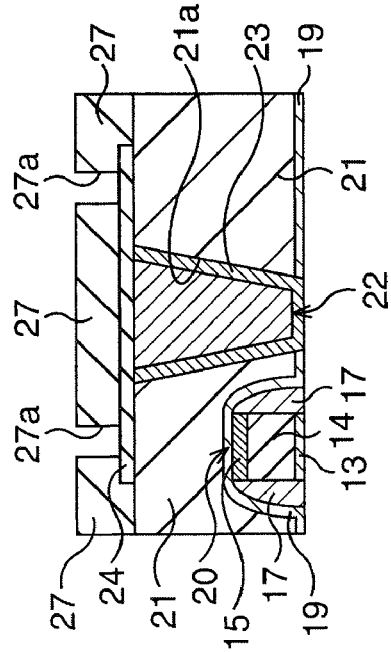
FIG. 4A is a schematic sectional view showing the manufacturing method of the FeRAM according to the first embodiment in the order of the steps.

Subsequently, as shown in FIG. 4A, the interlayer insulating film 27 is processed using the resist pattern 29.

Figure 8A:
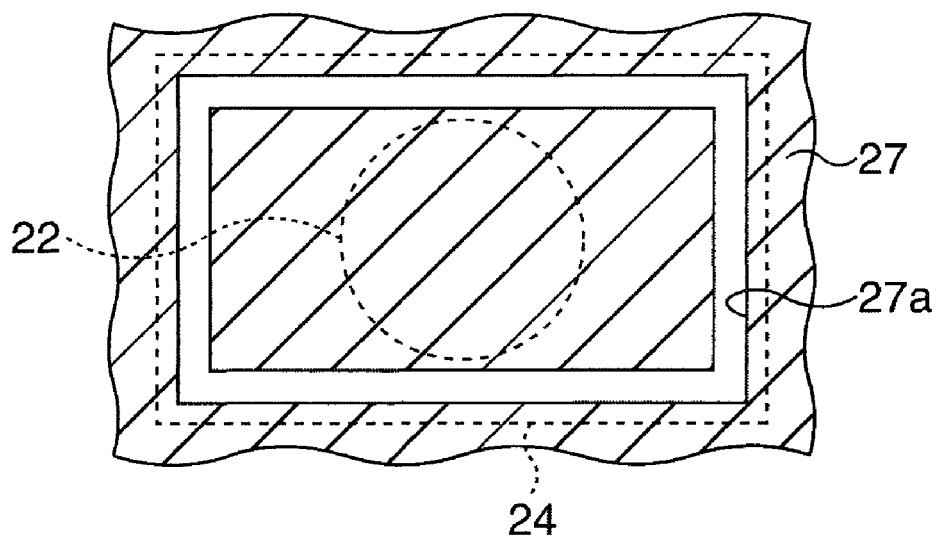
FIG. 8A is a schematic plan view showing a groove formed in an interlayer insulating film.

Specifically, the interlayer insulating film 27 is dry etched using the resist pattern 29 as a mask. At the same time, the anti-reflection film 28 is etched as well. Through this dry etching, in the interlayer insulating film 27, a groove 27a exposing an end portion of the conductive film 24 so as to form a frame shape along the end portion of the conductive film 24 is formed in a manner following the groove 29a of the resist pattern 29. An appearance of the groove 27a formed in the interlayer insulating film 27 is shown in plan view in FIG. 8A. The groove 27a of a frame shape has a minute size, therefore, sometimes it is not easy to form the groove 27a. Therefore, it is easily possible to form the minute groove 27a of a frame shape by employing, for example, an electron beam (EB) exposure technology and a resist flow technology being a technology to reduce a space of an opening (being a groove here) by heat of resist cure. After this dry etching, the resist pattern 29 and the anti-reflection film 28 thereunder are removed.

Figure 4C:
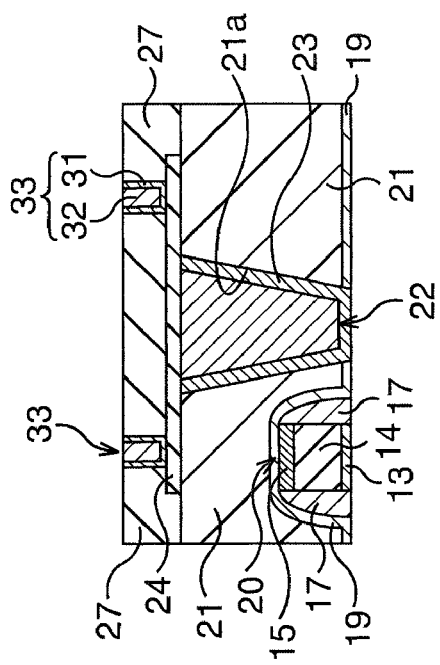
FIG. 4C is a schematic sectional view showing the manufacturing method of the FeRAM according to the first embodiment in the order of the steps.
Figure 4B:
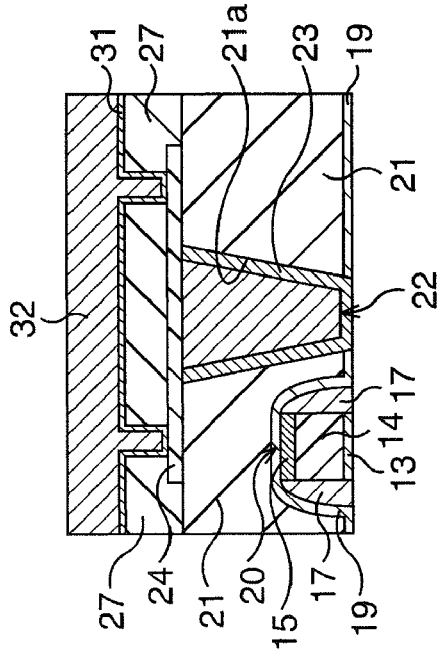
FIG. 4B is a schematic sectional view showing the manufacturing method of the FeRAM according to the first embodiment in the order of the steps.

Subsequently, as shown in FIG. 4B, a conductive material 32 is deposited such that the groove 27a is buried therewith.

Specifically, first, for example, a TiN film is deposited by sputtering method on the interlayer insulating film 27 to have a film thickness of about 20 nm so as to cover a wall surface of the groove 27a to thereby form a base film (glue film) 31. Subsequently, a conductive material 32 is deposited by CVD method such that the groove 27a is buried therewith via the glue film 31. As a conductive material 32, here, a tungsten (W) film is formed to have a film thickness of about 400 nm.

Subsequently, as shown in FIG. 4C, a connecting portion 33 is formed.

Figure 8B:
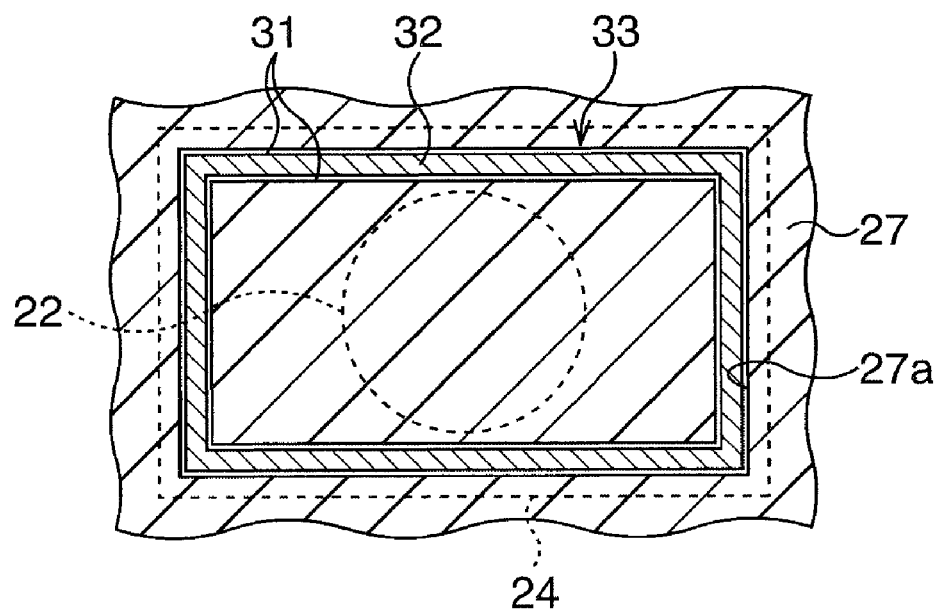
FIG. 8B is a schematic plan view showing a connecting portion formed in the groove formed in the interlayer insulating film.

Specifically, the conductive material 32 and the glue film 31 are polished, for example, by CMP using the interlayer insulating film 27 as a stopper to form the connecting portion 33 of a frame shape being the groove 27a of which inside is buried with the conductive material 32 via the glue film 31. An appearance of the connecting portion 33 formed in the groove 27a is shown in plan view in FIG. 8B. After that, through an $N_2$ annealing process at a relatively low temperature, a curing is performed with respect to the interlayer insulating film 27 to thereby perform dehydration treatment thereto. Here, when an annealing process is performed at a high temperature, the surface of W being the conductive material 32 is oxidized, hence, from a viewpoint of preventing the oxidization, an annealing process at a relatively low temperature of about 350° C. is performed for two minutes using, for example, $N_2$ gas.

Figure 4D:
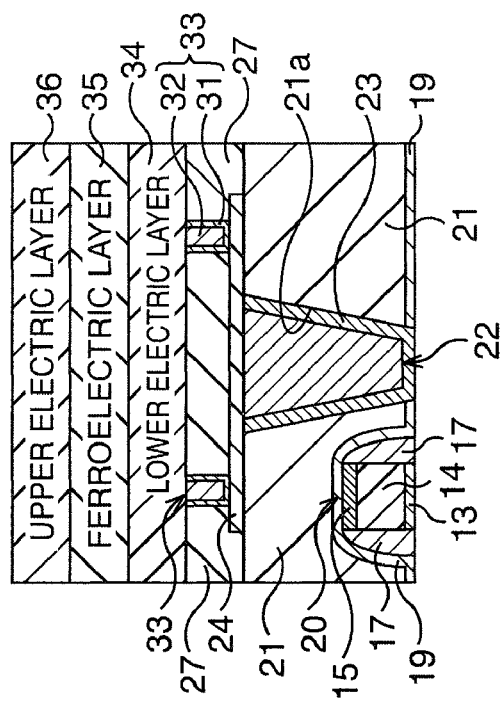
FIG. 4D is a schematic sectional view showing the manufacturing method of the FeRAM according to the first embodiment in the order of the steps.

Subsequently, as shown in FIG. 4D, a lower electrode layer 34, a ferroelectric film 35, and an upper electrode layer 36 are formed sequentially.

Specifically, first, for example, a Ti film having a film thickness of about 20 nm and a Pt film having a film thickness of about 150 nm are sequentially deposited on the interlayer insulating film 27 including the portion on the connecting portion 33 by sputtering method to form the lower electrode layer 34 of a stacked structure formed by the Ti film and the Pt film. Here, the lower electrode layer 34 may be formed via a conductive barrier film (not shown) by forming the conductive barrier film first on the interlayer insulating film 27.

Subsequently, the ferroelectric film 35 being a ferroelectric formed by, for example, PZT ($PbZr_xTi_{1-x}O_3$ 0<x<1) is deposited on the lower electrode layer 34 to have a film thickness of about 200 nm. Then, RTA process is performed to the ferroelectric film 35 to crystallize the ferroelectric film 35. Subsequently, the upper electrode layer 36 formed by, for example, $IrO_2$ being a conductive oxide, as a material, is deposited on the ferroelectric film 35 by reactive sputtering method to have a film thickness of about 200 nm.

Here, as a material for the lower electrode layer 34, instead of the stacked structure formed by Ti and Pt, a stacked structure formed by Ir and Pt, a stacked structure formed by $IrO_2$ and Pt, or a three-layered stacked structure formed by Ir, $IrO_2$, and Pt, each sequentially from the lower layer, is also acceptable. Further, as a material for the ferroelectric film 35, instead of PZT, SBT or BLT may be used. Furthermore, as a material for the upper electrode layer 36, instead of $IrO_2$, Ir, Ru, $RuO_2$, $SrRuO_3$, or other conductive oxide, or a stacked structure formed by these is also acceptable.

In the present embodiment, the surface of the interlayer insulating film 27 is planarized to block the impact of the orientation/level difference of the W plug 22, so that the interlayer insulating film 27 has excellent orientation in the surface thereof. Meanwhile, in the surface of the connecting portion 33, inevitably, the orientation is low, generating a certain level difference from the surface of the interlayer insulating film 27. Consequently, except the portion directly on the connecting portion 33, each of the lower electrode layer 34, the ferroelectric film 35 and the upper electrode layer 36 formed by being deposited on the interlayer insulating film has excellent orientation without inheriting the impact of the orientation/level difference of the W plug 22. Particularly, the ferroelectric film 35 can be formed to have excellent orientation and high ferroelectric characteristics except the portion directly on the connecting portion 33.

Figure 5A:
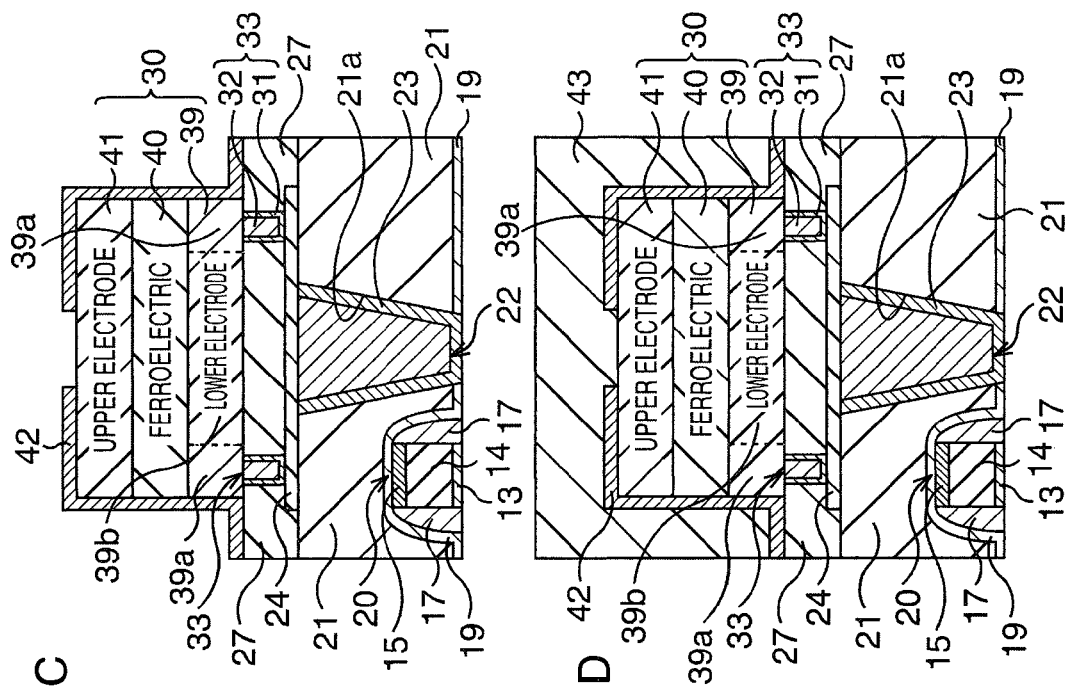
FIG. 5A is a schematic sectional view showing the manufacturing method of the FeRAM according to the first embodiment in the order of the steps.

Subsequently, as shown in FIG. 5A, a resist pattern 38 to process the lower electrode layer 34, the ferroelectric film 35 and the upper electrode layer 36 is formed.

Specifically, after an anti-reflection film 37 (which is possible to be omitted) is formed on the upper electrode layer 36 by coating, a resist is formed on the anti-reflection film 37 by coating. The resist is then processed by lithography to form the resist pattern 38.

Figure 5B:
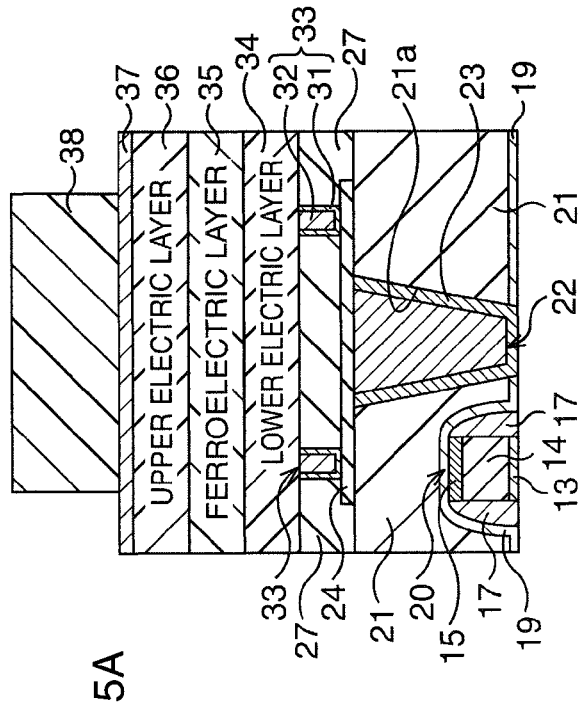
FIG. 5B is a schematic sectional view showing the manufacturing method of the FeRAM according to the first embodiment in the order of the steps.

Subsequently, as shown in FIG. 5B, with the use of the resist pattern 38, the upper electrode layer 36, the ferroelectric film 35, and the lower electrode layer 34 are processed to form a ferroelectric capacitor structure 30.

Specifically, by using the resist pattern 38 as a mask, the upper electrode layer 36, the ferroelectric film 35 and the lower electrode layer 34 are dry etched. At the same time, the anti-reflection film 37 is etched as well. Through this dry etching, in a manner following the resist pattern 38, the lower electrode layer 34, the ferroelectric film 35, and the upper electrode layer 36 are formed into the ferroelectric capacitor structure 30 formed by sandwiching a ferroelectric film 40 being the patterned ferroelectric film 35 between a lower electrode 39 and an upper electrode 41. After that, the resist pattern 38 and the anti-reflection film 37 thereunder are removed.

As described above, in the present embodiment, the example where the upper electrode layer 36, the ferroelectric film 35, and the lower electrode layer 34 are etched all at once using the single-layered resist pattern 38 (single-layered resist process) was presented. When carrying out the single-layered resist process, it is necessary to form the resist pattern 38 to have a relatively large thickness. When the single-layered resist process is difficult, it is acceptable to execute a two-layered resist process, in which, after the upper electrode layer 36 and the ferroelectric film 35 are etched together using a first resist pattern, the lower electrode layer 34 is etched using a second resist pattern, or a three-layered resist process, in which, the upper electrode layer 36, the ferroelectric film 35, and the lower electrode layer 34 are etched using the first to a third resist pattern sequentially.

Further, instead of the two-layered resist process or the three-layered resist process, a use of a so-called hard mask method is also preferable.

FIG. 9A to FIG. 10C show appearances of executing the steps in FIG. 5A and FIG. 5B by employing the hard mask method.

Figure 9A:
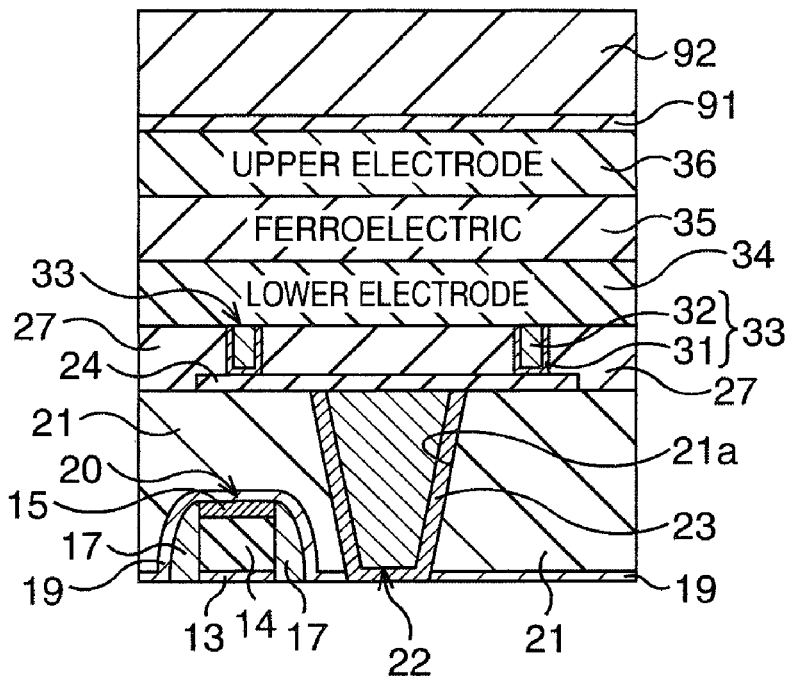
FIG. 9A is a schematic sectional view showing an appearance of executing the steps in FIGS. 5A and 5B by employing a hard mask method.

First, after completing the step in FIG. 4D, as shown in FIG. 9A, a TiN film 91 and a silicon oxide film 92 are stacked sequentially on the upper electrode layer 36. As a TiN film 91, it is formed to have a film thickness of 200 nm, for example, by sputtering. As a silicon oxide film 92, it is formed as a high density plasma (HDP) film to have a film thickness of about 800 nm to 1000 nm by CDV method using TEOS or plasma CVD method. Here, TEOS is in use to form the silicon oxide film 92. Note that, in FIG. 9B to FIG. 10C thereafter, for the purpose of convenience of illustration, the lower electrode layer 34 and its upper layer portion only are shown.

Figure 9B:
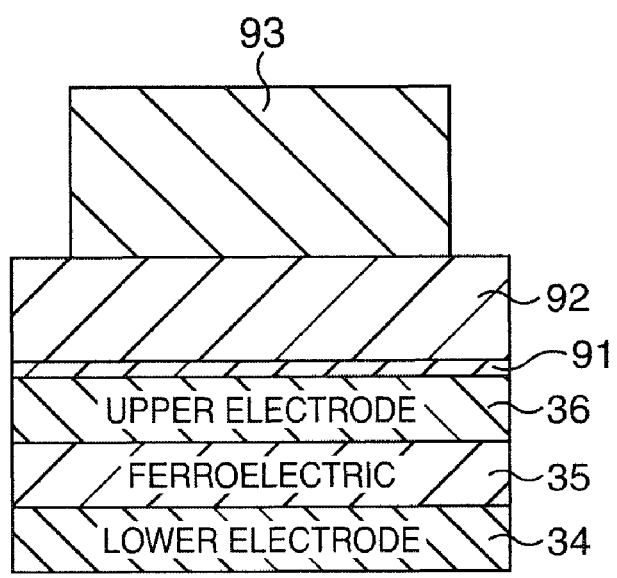
FIG. 9B is a schematic sectional view showing the appearance of executing the steps in FIGS. 5A and 5B by employing the hard mask method.

Subsequently, as shown in FIG. 9B, a resist pattern 93 of a capacitor shape is formed. Specifically, after a resist is coated on the silicon oxide film 92, the resist is processed to have a capacitor shape by lithography to form the resist pattern 93.

Figure 10A:
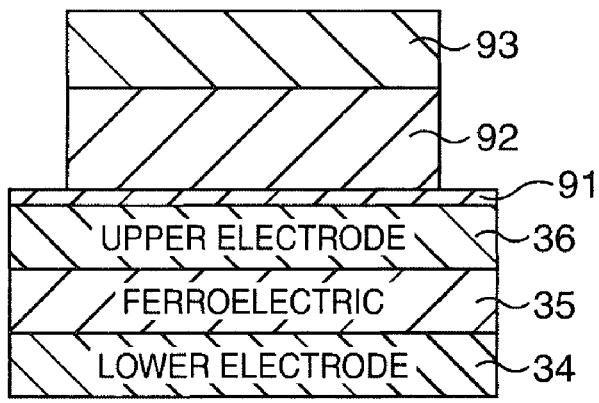
FIG. 10A is a schematic sectional view showing the appearance of executing the steps in FIGS. 5A and 5B by employing the hard mask method.

Subsequently, as shown in FIG. 10A, the silicon oxide film 92 is dry etched using the resist pattern 93 as a mask. Through this dry etching, the silicon oxide film 92 is patterned to have a capacitor shape in a manner following the resist pattern 93. After the silicon oxide film 92 is patterned, the resist pattern 93 is reduced in thickness due to the etching.

Figure 10B:
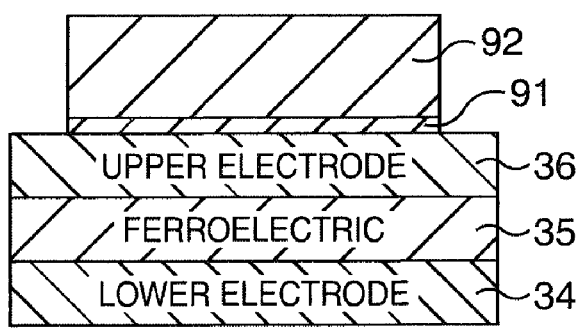
FIG. 10B is a schematic sectional view showing the appearance of executing the steps in FIGS. 5A and 5B by employing the hard mask method.

Subsequently, as shown in FIG. 10B, the TiN film 91 is dry etched using remaining the resist pattern 93 and the silicon oxide film 92 as a mask. Through this dry etching, the TiN film 91 is patterned to have a capacitor shape in a manner following the silicon oxide film 92. When the TiN film 91 is patterned, the resist pattern 93 mostly (or completely) disappears caused by the etching and the silicon oxide film 92 is reduced in thickness caused by the etching.

Figure 10C:
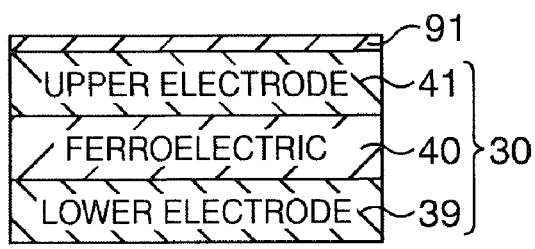
FIG. 10C is a schematic sectional view showing the appearance of executing the steps in FIGS. 5A and 5B by employing the hard mask method.

Subsequently, as shown in FIG. 10C, the lower electrode layer 34, the ferroelectric film 35 and the upper electrode layer 36 are dry etched using the remaining silicon oxide film 92 and TiN film 91 as a mask. Through this dry etching, the lower electrode layer 34, the ferroelectric film 35 and the upper electrode layer 36 are patterned to have a capacitor shape in a manner following the TiN film 91, so that the ferroelectric capacitor structure 30 sandwiching the ferroelectric film 40 between the lower electrode 39 and the upper electrode 41 is formed. The silicon oxide film 92 mostly (or completely) disappears caused by the etching.

After that, the TiN film 91 is peeled to be removed.

In the present embodiment, the lower electrode 39 is connected by the connecting portion 33 and the portion including the peripheral region of the lower electrode 39, and is connected in the peripheral region in the present embodiment. The peripheral region of the lower electrode 39 means inside the periphery of the lower electrode 39 and the region in the vicinity of the periphery, and in other words, the region of the under surface of the lower electrode 39 excluding the central region including the portion above the W plug 22 of the lower electrode 39. As one example, FIG. 5B shows a peripheral region 39a and a central region 39b of the lower electrode 39.

Here, as described above, in the interlayer insulating film 27, an inside the connecting portion 33 having the frame shape is the portion of which surface is highly planarized and exhibits excellent orientation. Meanwhile, in the surface of the connecting portion 33, inevitably, the orientation is low, generating a certain level difference from the surface of the interlayer insulating film 27. Hence, of the lower electrode 39, the central region 39b excluding the peripheral region 39a being a connected portion of the connecting portion 33 has excellent orientation without suffering the impact of the surface of the W plug 22. By inheriting the impact of the lower electrode 39, the ferroelectric film 40 has excellent orientation and high ferroelectric characteristics in the central region thereof aligned with the central region 39b excluding the peripheral region thereof aligned with the peripheral region 39a. The central region of the ferroelectric film 40 accounts for a large ratio, and even when viewed as a whole, it results to have excellent orientation and high ferroelectric characteristics.

Figure 5C:
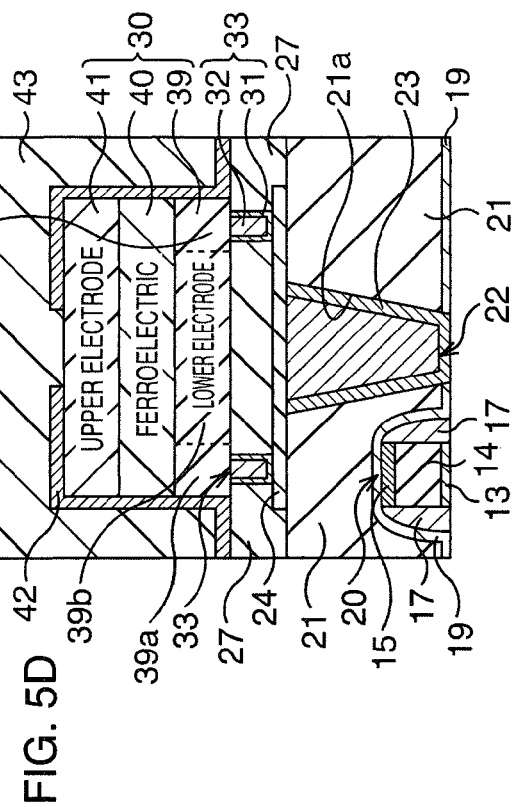
FIG. 5C is a schematic sectional view showing the manufacturing method of the FeRAM according to the first embodiment in the order of the steps.

Subsequently, as shown in FIG. 5C, a hydrogen protection film 42 protecting the ferroelectric capacitor structure 30 from characteristics degradation caused by hydrogen is formed.

Specifically, the hydrogen protection film 42 is formed to cover the ferroelectric capacitor structure 30. The hydrogen protection film 42 is to prevent the hydrogen generated in the steps after the formation of the ferroelectric capacitor structure 30 from infiltrating into the ferroelectric capacitor structure 30 and its lower structure, and is formed, for example, by sputtering method to have a film thickness of about 50 nm to 100 nm using, for example, alumina (AlO) as a material.

Here, in order to obtain characteristics recovery sufficiently in a later-described annealing process for the purpose of recovering the characteristics of the ferroelectric film 40, a part of the hydrogen protection film 42 may be patterned to be removed so as to expose a part of the surface of the upper electrode 41. This removal step may be omitted, whereas FIG. 5C shows an appearance in the case where the removal step is performed.

Figure 5D:
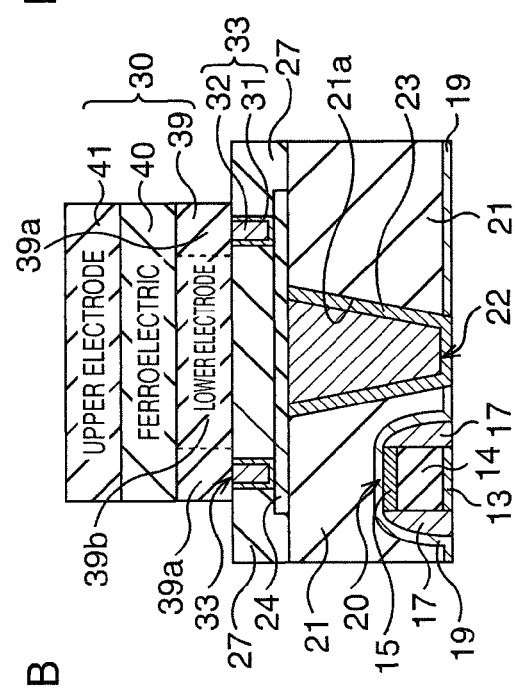
FIG. 5D is a schematic sectional view showing the manufacturing method of the FeRAM according to the first embodiment in the order of the steps.

Subsequently, as shown in FIG. 5D, an interlayer insulating film 43 is formed.

Specifically, the interlayer insulating film 43 is formed to completely cover the ferroelectric capacitor structure 30 via the hydrogen protection film 42. As an interlayer insulating film 43, when the thickness of the ferroelectric capacitor structure 30 is about 800 nm as an example, a silicon oxide film is deposited to have a film thickness of about 1500 nm by CVD method using, for example, TEOS to completely cover the ferroelectric capacitor structure 30. After that, in order to remove a level difference on the surface of the interlayer insulating film 43 formed by covering the ferroelectric capacitor structure 30, the surface layer of the interlayer insulating film 43 is removed, for example, by CMP method such that the interlayer insulating film 43 has a remaining film thickness of about 300 nm to 400 nm. With this, the surface of the interlayer insulating film 43 is planarized.

Figure 6A:
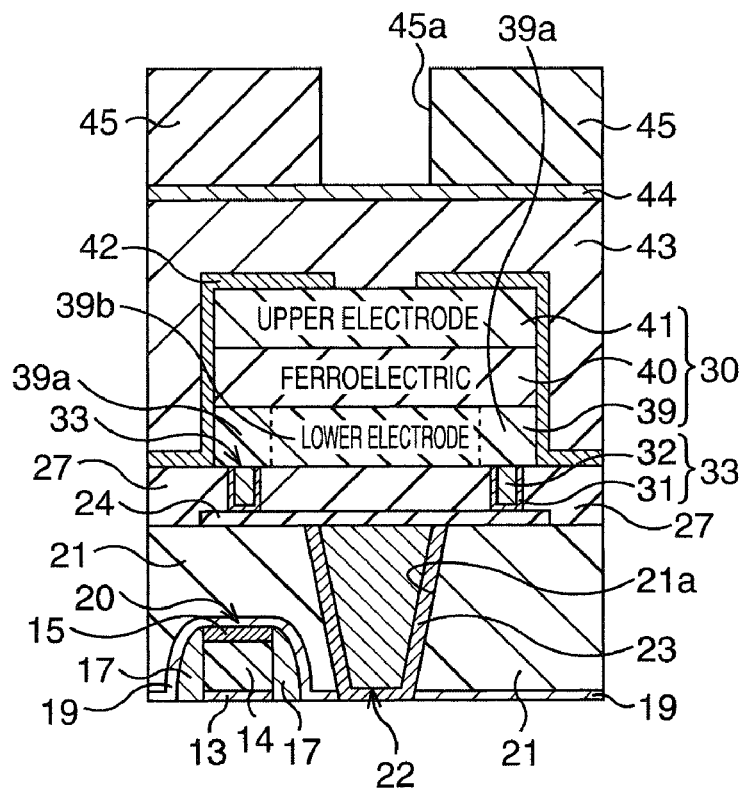
FIG. 6A is a schematic sectional view showing the manufacturing method of the FeRAM according to the first embodiment in the order of the steps.

Subsequently, as shown in FIG. 6A, a resist pattern 45 to form a via hole in the interlayer insulating film 43 is formed.

Specifically, after an anti-reflection film 44 (which is possible to be omitted) is formed on the interlayer insulating film 43 by coating, a resist is formed on the anti-reflection film 44 by coating. Then, the resist is processed by lithography to form the resist pattern 45 with an opening 45a aligned with a predetermined position on the surface of the upper electrode 41.

Figure 6B:
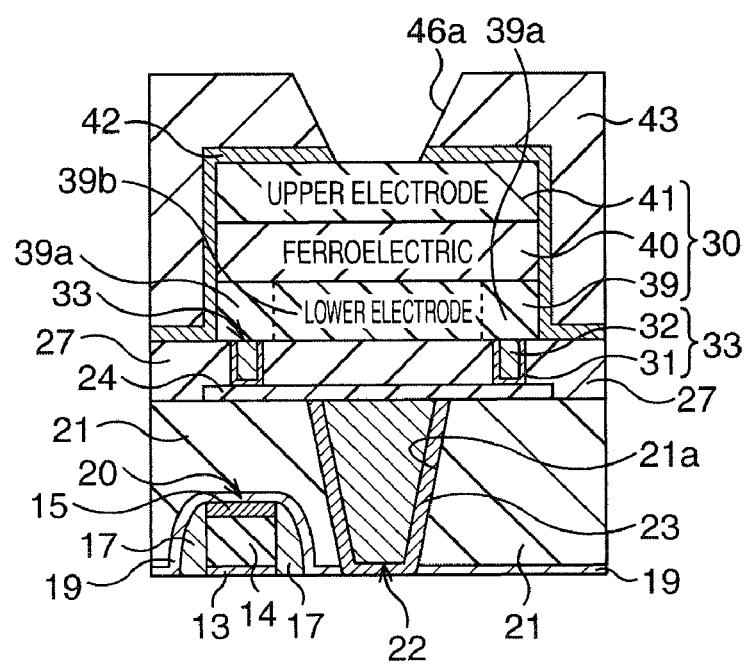
FIG. 6B is a schematic sectional view showing the manufacturing method of the FeRAM according to the first embodiment in the order of the steps.

Subsequently, as shown in FIG. 6B, the interlayer insulating film 43 is processed using the resist pattern 45.

Specifically, the interlayer insulating film 43 and the hydrogen protection film 42 are partially dry etched using the resist pattern 45 as a mask. At the same time, the anti-reflection film 44 is etched as well. In the interlayer insulating film 43 and the hydrogen protection film 42, through this dry etching, a via hole 46 exposing a part of the surface of the upper electrode 41 is formed in a manner following the opening 45a of the resist pattern 45. After that, the resist pattern 45 and the anti-reflection film 44 thereunder are removed.

Subsequently, an annealing process to recover damages that the ferroelectric film 40 is suffered in the forming step of the ferroelectric capacitor structure 30 and the steps thereafter is performed. Here, the annealing process is performed in an oxygen atmosphere of 20 litters of $O_2$/minute under a processing temperature of 500° C. for 60 minutes. At this time, the ferroelectric characteristics of the ferroelectric film 40 are recovered, while Pb and oxygen depart from the peripheral region of the ferroelectric film 40 to lower the concentration levels of Pb and oxygen in the peripheral region. Due to this departure of Pb and oxygen, in the peripheral region of the ferroelectric film 40, the ferroelectric characteristics thereof inevitably degrade.

In the present embodiment, by actively taking advantage of the peripheral region of the ferroelectric film 40, of which ferroelectric characteristics inevitably degrade, the connecting portion 33 inevitably bringing the degradation of the ferroelectric characteristics of the ferroelectric film 40 is provided at the peripheral region 39a of the lower electrode 39 as described above. With this structure, the ferroelectric film 40 can be formed to have the orientation being as excellent as possible and the ferroelectric characteristics being as high as possible.

Figure 7A:
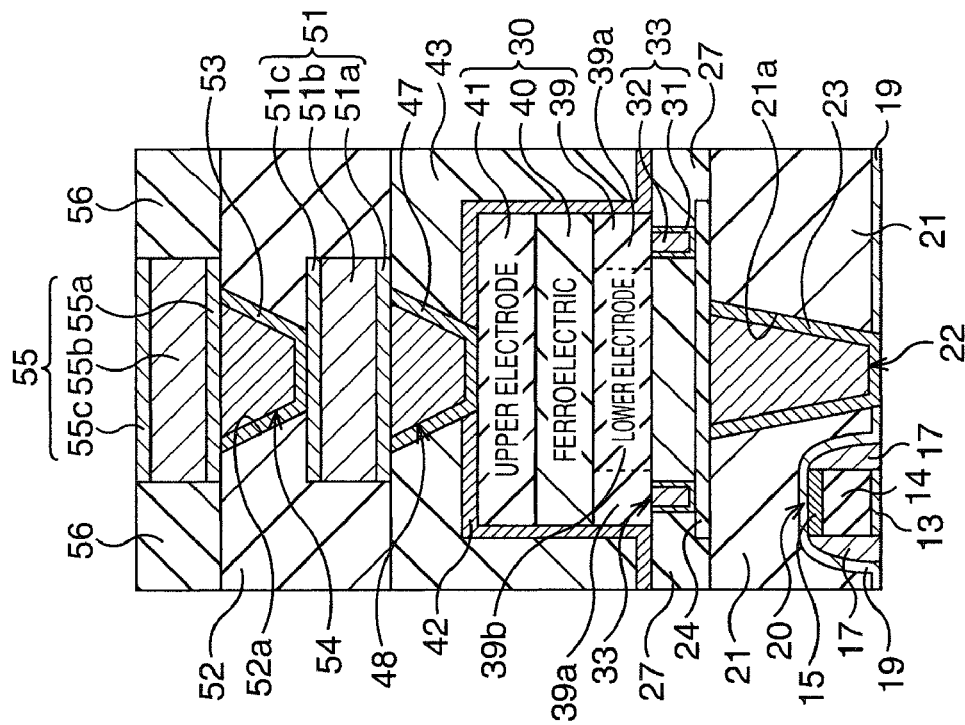
FIG. 7A is a schematic sectional view showing the manufacturing method of the FeRAM according to the first embodiment in the order of the steps.

Subsequently, as shown in FIG. 7A, a W plug 48 connected to the upper electrode 41 is formed.

Specifically, for example, a Ti film (of a film thickness of about 30 nm) and a TiN film (of a film thickness of about 20 nm) are deposited sequentially on the interlayer insulating film 43 by sputtering method so as to cover a wall surface of the via hole 46 to form a base (glue) film 47. After that, a tungsten (W) film is formed by CVD method to bury the via hole 46 via the glue film 47. For example, by CMP, the W film and the glue film 47 are polished using the interlayer insulating film 43 as a stopper to form the W plug 48 burying the inside of the via hole 46 with W via the glue film 47.

Here, in the present embodiment, the W plug 22 and the W plug 48 are formed almost vertically in alignment with each other by sandwiching the conductive film 24, the interlayer insulating film 27 and the ferroelectric capacitor structure 30 therebetween. With this structure, the occupied area of the memory cell section including the ferroelectric capacitor structure 30 can be suppressed to as small as possible.

Figure 7B:
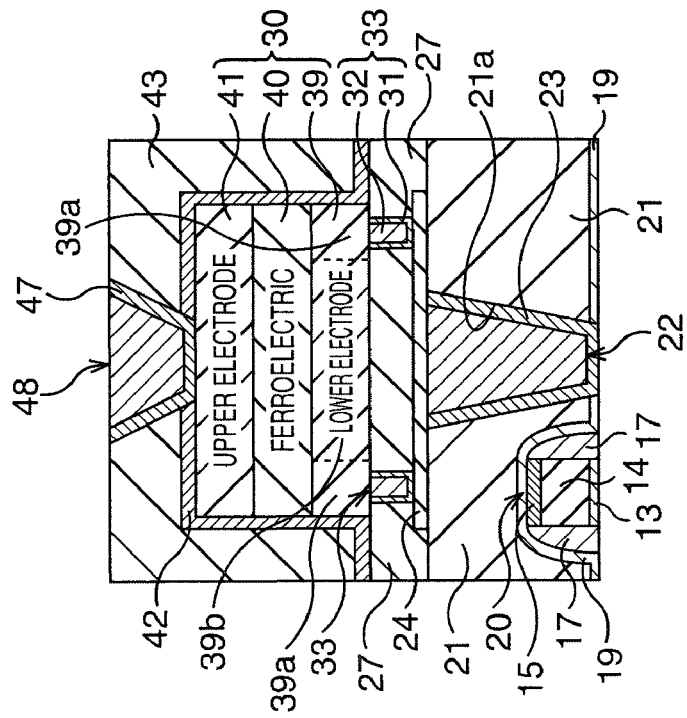
FIG. 7B is a schematic sectional view showing the manufacturing method of the FeRAM according to the first embodiment in the order of the steps.

Subsequently, as shown in FIG. 7B, a multilayer wiring structure 50 is formed.

Specifically, first, a first wiring 51 connected to the W plug 48 is formed.

More specifically, on the interlayer insulating film 43 including on the W plug 48, for example, TiN is deposited to have a film thickness of about 150 nm by sputtering method to form a barrier layer 51a. Subsequently, on the barrier layer 51a, for example, an Al—Cu alloy is deposited by sputtering method to have a film thickness of about 550 nm to form a wiring layer 51b. Then, on the wiring layer 51b, for example, TiN is deposited by sputtering method to have a film thickness of about 150 nm to form a barrier layer 51c. These barrier layer 51c, wiring layer 51b and barrier layer 51a are patterned to have a desired wiring shape by lithography followed by dry etching to form the first wiring 51 sandwiching the wiring layer 51b between the barrier layers 51a, 51c.

Subsequently, a W plug 54 connected to the first wiring 51 is formed.

Specifically, first, an interlayer insulating film 52 covering the first wiring 51 is formed. Here, as an interlayer insulating film 52, a silicon oxide film is deposited to have a film thickness of about 2500 nm by CVD method using, for example, TEOS. After that, the surface of the interlayer insulating film 52 is planarized, for example, by CMP method.

Subsequently, the interlayer insulating film 52 is processed by lithography followed by dry etching to the extent that a part of the surface of the barrier layer 51c exposes to form a via hole 52a. Then, a Ti film (of a film thickness of about 30 nm) and a TiN film (of a film thickness of about 20 nm) are deposited sequentially on the interlayer insulating film 52 by sputtering method so as to cover a wall surface of the via hole 52a to form a base (glue) film 53.

After that, a tungsten (W) film is formed by CVD method to bury the via hole 52a via the glue film 53. For example, by CMP, the W film and the glue film 53 are polished using the interlayer insulating film 52 as a stopper to form the W plug 54 burying the inside of the via hole 52 with W via the glue film 53.

Subsequently, a second wiring 55 connected to the W plug 54 is formed.

Specifically, on the interlayer insulating film 52 including on the W plug 54, for example, TiN is deposited to have a film thickness of about 150 nm by sputtering method to form a barrier layer 55a. Subsequently, on the barrier layer 55a, for example, an Al—Cu alloy is deposited by sputtering method to have a film thickness of about 550 nm to form a wiring layer 55b.

Then, on the wiring layer 55b, for example, TiN is deposited by sputtering method to have a film thickness of about 150 nm to form a barrier layer 55c. These barrier layer 55c, wiring layer 55b and barrier layer 55a are patterned to have a desired wiring shape by lithography followed by dry etching to form the second wiring 55 sandwiching the wiring layer 55b between the barrier layers 55a, 55c.

Here, after an interlayer insulating film 56 is formed, further the formation of a W plug and a wiring is repeated to the extent of forming, for example, a twentieth wiring, so that the multilayer wiring structure 50 is formed. In FIG. 7B, for convenience of drawing, those up to the second wiring 55 are shown.

Note that, in the present embodiment, as a material for each wiring layer in the multilayer wiring structure 50, Al is described as an example, however, it is also acceptable to use Cu by so-called damascene method in stead of forming Al by sputtering. In that case, when employing the first wiring 51 as an example, the interlayer insulating film 52 is formed first, and after the surface thereof is planarized, a groove of a desired wiring shape is formed in the interlayer insulating film 52 so that the surface of the W plug 48 exposes at the bottom surface of the groove. Then, for example, Ta is deposited on a wall surface of the groove, for example, by MOCVD method to form a barrier film, and subsequently, a plating seed film is formed on the barrier film and, after that, Cu is deposited so as to bury the inside of the groove by plating method. After that, the surface layer of Cu (and the plating seed film) is (are) removed by CMP method using the interlayer insulating film 52 as a stopper to form the first wiring 51 filling the inside of the groove with Cu.

After that, the steps of forming a protection film, a pad electrode, and the like (not shown) is performed, so that a FeRAM according to the present embodiment is completed.

As described above, according to the present embodiment, by adopting the stack-type capacitor structure for the ferroelectric capacitor structure 30, the highly reliable FeRAM reducing the occupied area of the capacitor while assuring relatively large capacitance, however capable of obtaining the same high orientation as of when a planer-type capacitor structure is adopted or above in the ferroelectric film 40, and thereby capable of obtaining excellent ferroelectric characteristics is realized.

MODIFICATION EXAMPLES

Hereinafter, the description will be given of modification examples of the first embodiment. In these modification examples, the same components and the like as those disclosed in the first embodiment will be denoted by the same numerical references and omitted to be described in detail.

First Modification Example

In the present example, a case where the connecting portion formed on the conductive film 24 is formed to have a plug shape will be presented as an example.

FIG. 11A to FIG. 11D are schematic sectional views showing major steps out of a manufacturing method of a FeRAM according to a first modification example.

First, as in the first embodiment, through the respective steps in FIG. 3A to FIG. 3F, above the silicon semiconductor substrate 10, the interlayer insulating film 27 is formed on the interlayer insulating film 21 such that the conductive film 24 is buried therein.

Figure 11A:
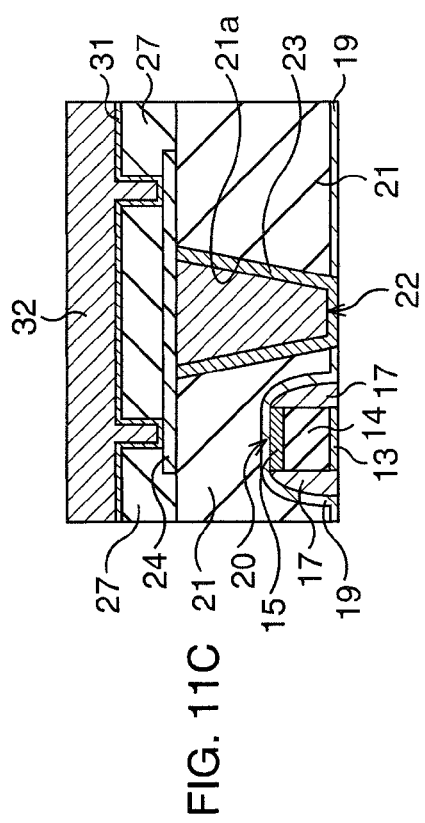
FIG. 11A is a schematic sectional view showing a major step out of a manufacturing method of a FeRAM according to a first modification example.

Subsequently, as shown in FIG. 11A, a resist pattern 61 to form openings in the interlayer insulating film 27 is formed.

Specifically, after the anti-reflection film 28 (which is possible to be omitted) is formed on the interlayer insulating film 27 by coating, a resist is formed on the anti-reflection film 28 by coating. Then, the resist is processed by lithography to form a resist pattern 61 with respective four openings 61a aligned with four corner positions of the peripheral region of the conductive film 24.

Figure 11B:
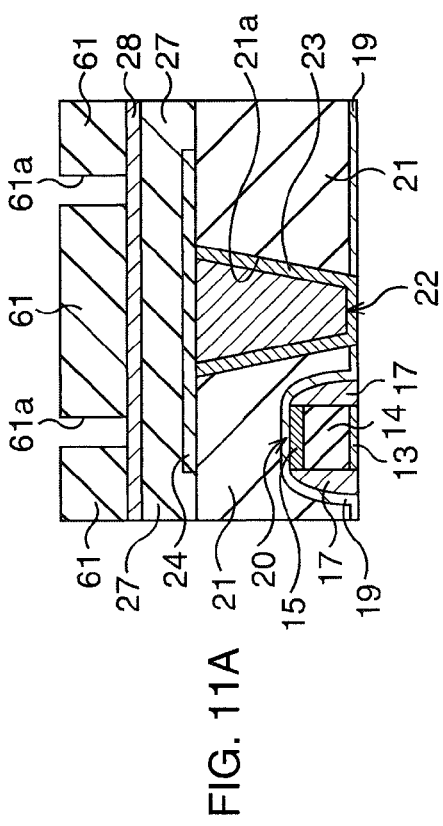
FIG. 11B is a schematic sectional view showing a major step out of the manufacturing method of the FeRAM according to the first modification example.

Subsequently, as shown in FIG. 11B, the interlayer insulating film 27 is processed using the resist pattern 61.

Figure 12A:
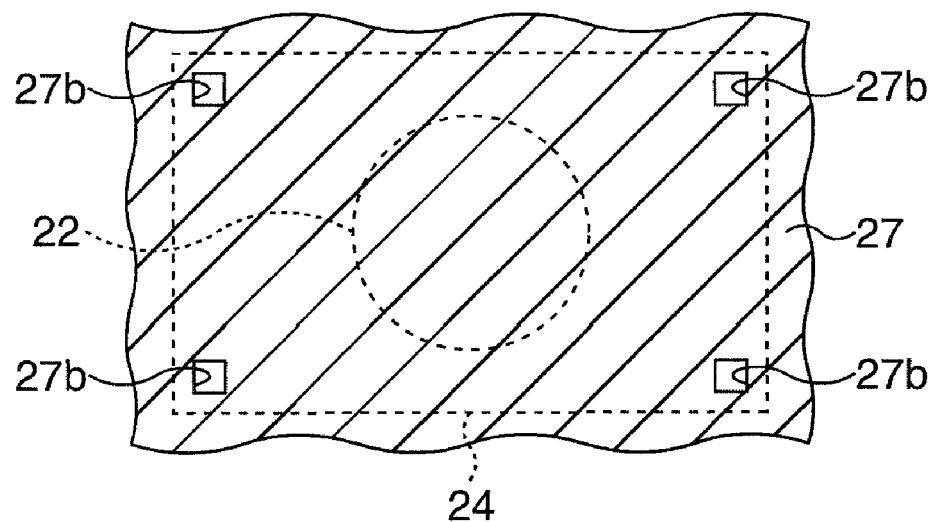
FIG. 12A is a schematic plan view showing holes formed in the interlayer insulating film.

Specifically, the interlayer insulating film 27 is dry etched using the resist pattern 61 as a mask. At the same time, the anti-reflection film 28 is etched as well. In the interlayer insulating film 27, through this dry etching, respective openings 27b exposing parts of an end portion of the conductive film 24 are formed in a manner following the respective openings 61a of the resist pattern 61. An appearance of the respective openings 27b formed in the interlayer insulating film 27 is shown in plan view in FIG. 12A. The openings 27b have a relatively simple shape, enabling themselves to be formed easily. After this dry etching, the resist pattern 61 and the anti-reflection film 28 thereunder are removed.

Figure 11C:
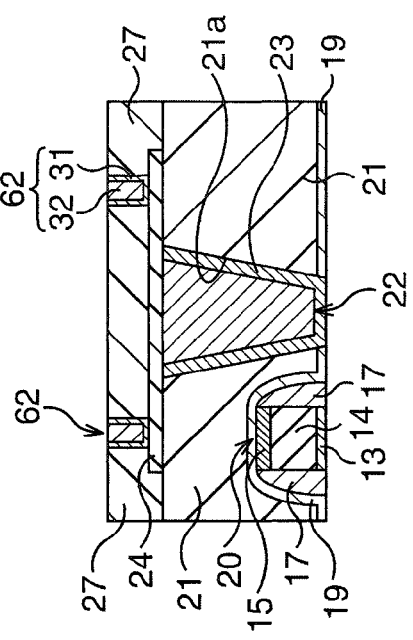
FIG. 11C is a schematic sectional view showing a major step out of the manufacturing method of the FeRAM according to the first modification example.

Subsequently, as shown in FIG. 11C, the conductive material 32 is deposited such that the respective openings 27b are buried therewith.

Specifically, first, for example, TiN is deposited by sputtering method on the interlayer insulating film 27 to have a film thickness of about 20 nm to cover wall surfaces of the respective openings 27b to form the base film (glue film) 31. Subsequently, a conductive material 32 is deposited by CVD method such that the openings 27b are buried therewith via the glue film 31. As a conductive material 32, here, a tungsten (W) film is formed to have a film thickness of about 400 nm.

Figure 11D:
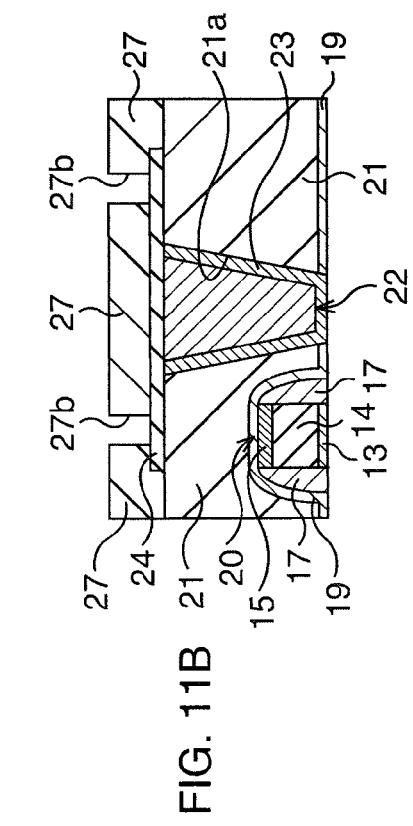
FIG. 11D is a schematic sectional view showing a major step out of the manufacturing method of the FeRAM according to the first modification example.

Subsequently, as shown in FIG. 11D, connecting portions 62 are formed.

Figure 12B:
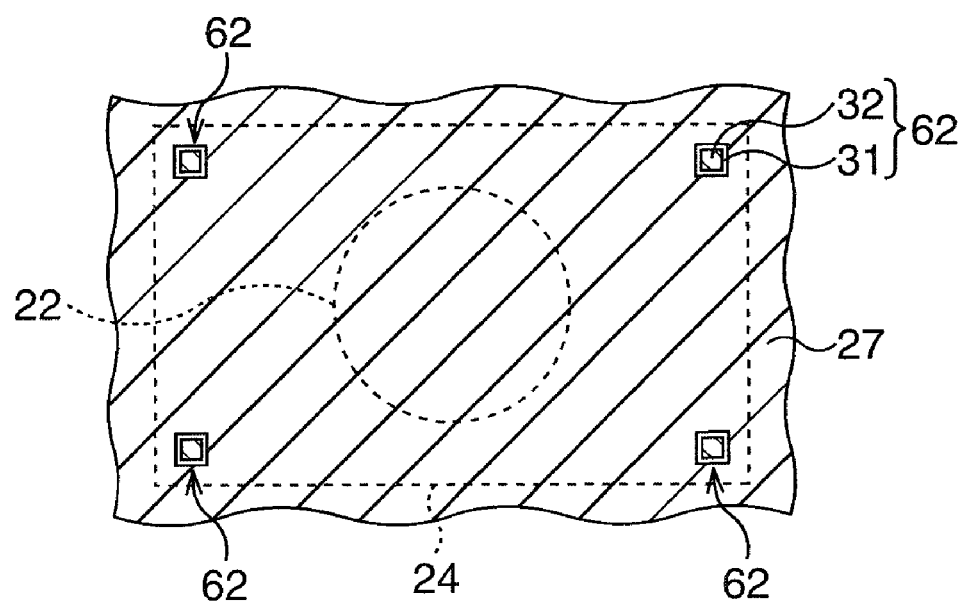
FIG. 12B is a schematic plan view showing connecting portions formed in the holes formed in the interlayer insulating film.

Specifically, the conductive material 32 and the glue film 31 are polished, for example, by CMP using the interlayer insulating film 27 as a stopper to form the respective connecting portions 62 each having a plug shape being the respective openings 27b buried with the conductive material 32 via the glue film 31. An appearance of the respective connecting portions 62 formed in the respective openings 27b are shown in plan view in FIG. 12B. After that, through an annealing process at a relatively low temperature, a curing is performed with respect to the interlayer insulating film 27 to thereby perform dehydration treatment thereto. Here, when the annealing process is performed at a high temperature, the surface of W being the conductive material 32 is oxidized, hence, from a viewpoint of preventing the oxidization, the annealing process at a relatively low temperature of about 350° C. is performed for two minutes using, for example, $N_2$ gas.

Note that it is acceptable that the respective connecting portions 62 are formed at two facing corner positions in the peripheral region of the conductive film 24 instead of forming the respective four connecting portions 62.

Subsequently, as in the first embodiment, through the respective steps in FIG. 4D, FIG. 5A, FIG. 5B, the ferroelectric capacitor structure 30 is formed.

In the ferroelectric capacitor structure 30, the lower electrode 39 is connected by the connecting portions 62 and the portion including the peripheral region 39a of the lower electrode 39, and is connected in the peripheral region 39a in the present embodiment. Of the lower electrode 39, the central region 39b except the peripheral region 39a being the connected portion of the connecting portions 62 has excellent orientation without suffering the impact of the surface of the W plug 22. By inheriting the impact of the lower electrode 39, the ferroelectric film 40 has excellent orientation and high ferroelectric characteristics in the central region thereof aligned with the central region 39b excluding the peripheral region thereof aligned with the peripheral region 39a. The central region of the ferroelectric film 40 accounts for a large ratio, and even when viewed as a whole, it results to have excellent orientation and high ferroelectric characteristics.

After that, as in the first embodiment, through the respective steps in FIG. 5C, FIG. 5D, FIG. 6A, FIG. 6B, FIG. 7A, FIG. 7B, the FeRAM according to the present example is completed.

As described above, according to the first modification example, by adopting the stack-type capacitor structure for the ferroelectric capacitor structure 30, the highly reliable FeRAM reducing the occupied area of the capacitor while assuring relatively large capacitance, however capable of obtaining the same high orientation as of when a planer-type capacitor structure is adopted or above in the ferroelectric film 40, and thereby capable of obtaining excellent ferroelectric characteristics is realized.

Second Modification Example

In the present example, a case where, as a conductive material 32 for the connecting portion, a conductive substance other than W is in use will be presented as an example.

Figure 13A:
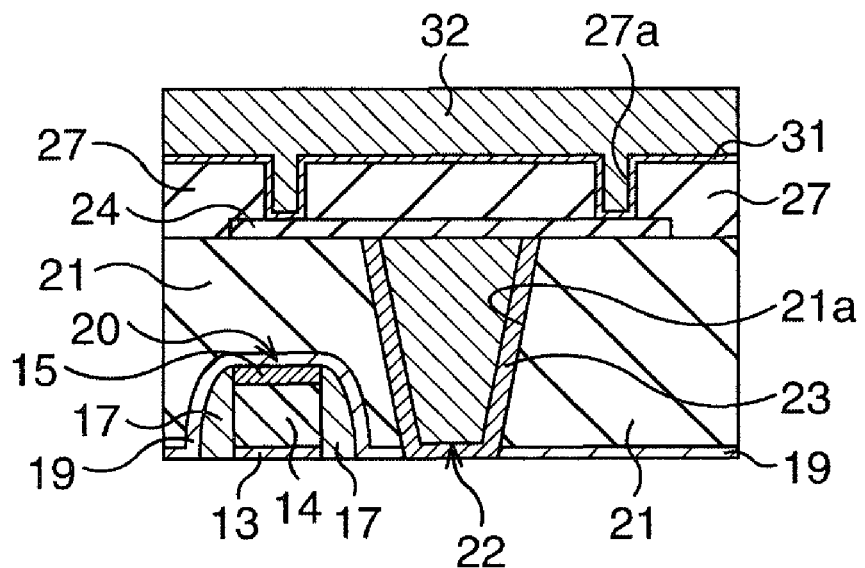
FIG. 13A is a schematic sectional view showing a major step out of a manufacturing method of a FeRAM according to a second modification example.
Figure 13B:
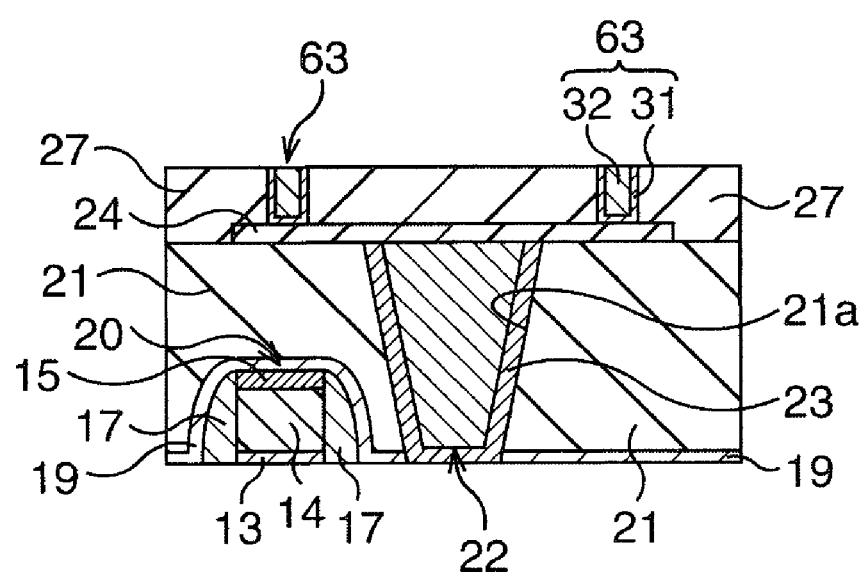
FIG. 13B is a schematic sectional view showing a major step out of the manufacturing method of the FeRAM according to the second modification example.

FIG. 13A and FIG. 13B are schematic sectional views showing major steps out of a manufacturing method of a FeRAM according to the second modification example.

First, as in the first embodiment, through the respective steps in FIG. 3A to FIG. 3G, FIG. 4A, above the silicon semiconductor substrate 10, the groove 27a of a frame shape is formed in the interlayer insulating film 27.

Subsequently, as shown in FIG. 13A, the conductive material 32 is deposited such that the groove 27a is buried therewith.

Specifically, first, for example, TiN is deposited by sputtering method on the interlayer insulating film 27 to have a film thickness of about 20 nm to cover the wall surface of the groove 27a to thereby form the base film (glue film) 31. Subsequently, the conductive material 32 is deposited by MOCVD method such that the groove 27a is buried therewith via the glue film 31. As a conductive material 32, here, Iridium (Ir) being a precious metal is formed to have a film thickness of about 300 nm or TiAlN being a conductive nitride film is formed to have a film thickness of about 300 nm. Further, as a conductive material 32, platinum (pt) is also applicable.

Subsequently, as shown in FIG. 13B, a connecting portion 63 is formed.

Specifically, the conductive material 32 and the glue film 31 are polished, for example, by CMP using the interlayer insulating film 27 as a stopper to form the connecting portion 63 of a frame shape being the groove 27a of which inside is buried with the conductive material 32 via the glue film 31.

Subsequently, through an annealing process, a curing is performed with respect to the interlayer insulating film 27 to thereby perform dehydration treatment thereto. In the present example, it is possible to perform the annealing process at a high temperature. In other words, in the case where Ir is used for the conductive material 32, even when the surface layer of the connecting portion 63 is oxidized and IrO$_2$ is generated, since IrO$_2$ is a conductive oxide, the connecting portion 63 can maintain favorable conductivity. Meanwhile, in the case where TiAlN is used for the conductive material 32, since TiAlN is a conductive nitride having excellent oxidation resistance, the connecting portion 63 can maintain favorable conductivity. In the present example, the annealing process is performed under the conditions of a relatively high temperature of 400° C. for two minutes by using, for example, N$_2$ gas.

After that, as in the first embodiment, through the respective steps in FIG. 4D, FIG. 5C, FIG. 5D, FIG. 6A, FIG. 6B, FIG. 7A, FIG. 7B, the FeRAM according to the present example is completed.

As described above, according to the second modification example, by adopting the stack-type capacitor structure for the ferroelectric capacitor structure 30, the highly reliable FeRAM reducing the occupied area of the capacitor while assuring relatively large capacitance, however capable of obtaining the same high orientation as of when a planer-type capacitor structure is adopted or above in the ferroelectric film 40, and thereby capable of obtaining excellent ferroelectric characteristics is realized.

Third Modification Example

In the present example, a case where, as a conductive material 32 for the connecting portion, a conductive substance other than W is in use will be presented as an example.

Figure 14A:
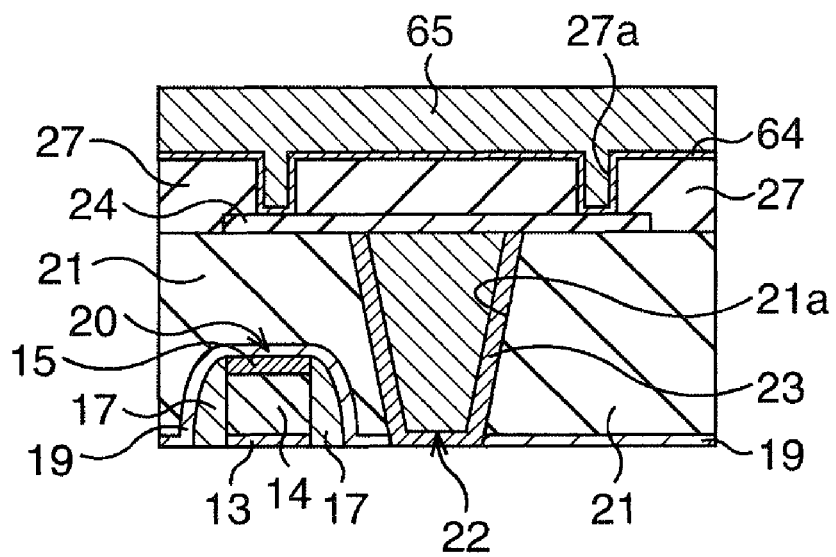
FIG. 14A is a schematic sectional view showing a major step out of a manufacturing method of a FeRAM according to a third modification example.
Figure 14B:
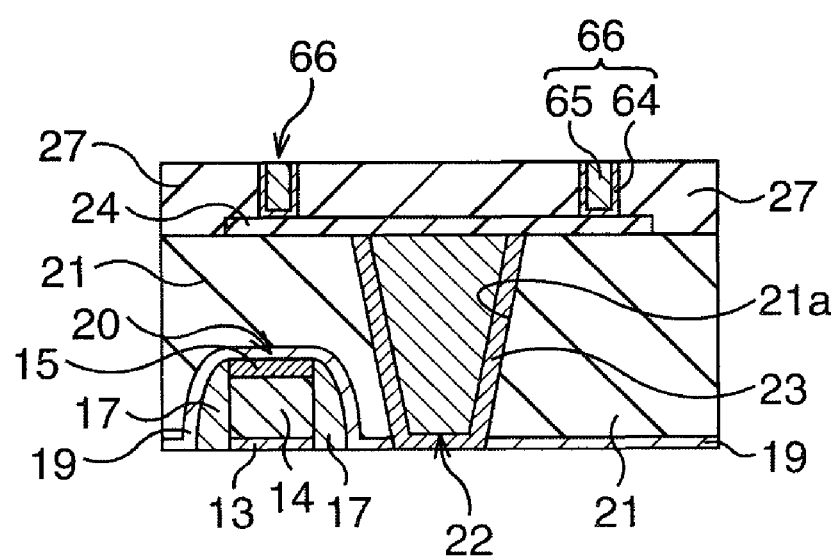
FIG. 14B is a schematic sectional view showing a major step out of the manufacturing method of the FeRAM according to the third modification example.

FIG. 14A and FIG. 14B are schematic sectional views showing major steps out of a manufacturing method of a FeRAM according to the third modification example.

First, as in the first embodiment, through the respective steps in FIG. 3A to FIG. 3G, FIG. 4A, above the silicon semiconductor substrate 10, the groove 27a of a frame shape is formed in the interlayer insulating film 27.

Subsequently, as shown in FIG. 14A, the conductive material 32 is deposited such that the groove 27a is buried therewith.

Specifically, first, for example, a Ta film is deposited by MOCVD method on the interlayer insulating film 27 (to have a film thickness of about 15 nm) to cover the wall surface of the groove 27a to thereby form a base film (glue film) 64.

Subsequently, after a plating seed film (not shown) is formed on the glue film 64, a Cu 65 is deposited to have a film thickness of about 600 nm such that the inside of the groove 27a is buried therewith.

Subsequently, as shown in FIG. 14B, a connecting portion 66 is formed.

Specifically, the conductive material 32 and the glue film 64 are polished, for example, by CMP using the interlayer insulating film 27 as a stopper to form the connecting portion 66 of a frame shape being the groove 27a of which inside is buried with the conductive material 32 via the glue film 64. After that, through an annealing process at a relatively low temperature, a curing is performed with respect to the interlayer insulating film 27 to thereby perform dehydration treatment thereto. Here, when the annealing process is performed at a high temperature, the surface of Cu being the conductive material 32 is oxidized, hence, from a viewpoint of preventing the oxidization, the annealing process is performed under the conditions of a relatively low temperature of about 350° C. for 60 seconds using, for example, N$_2$ gas or NH$_3$ gas.

Subsequently, as in the first embodiment, through the respective steps in FIG. 4D, FIG. 5A, FIG. 5B, the ferroelectric capacitor structure 30 is formed.

In the ferroelectric capacitor structure 30, the lower electrode 39 is connected by the connecting portions 66 and the portion including the peripheral region 39a of the lower electrode 39, and is connected in the peripheral region 39a in the present embodiment. Here, differently from the CVD method, in the plating method, the groove 27a can be buried with better filling performance without generating a seam and the like, and further, Cu is relatively flexible and has a polishing rate close to that for the interlayer insulating film 27, so that a level difference is difficult to be generated between the interlayer insulating film 27 and itself. Accordingly, with the use of Cu, even the groove 27a is minute, the groove 27a can be buried sufficiently.

Of the lower electrode 39, the central region 39b excluding the peripheral region 39a being the connected portion of the connecting portion 66 has excellent orientation without suffering the impact of the surface of the W plug 22. By inheriting the impact of the lower electrode 39, the ferroelectric film 40 has excellent orientation and high ferroelectric characteristics in the central region thereof aligned with the central region 39b excluding the peripheral region thereof aligned with the peripheral region 39a. The central region of the ferroelectric film 40 accounts for a large ratio, and even when viewed as a whole, it results to have excellent orientation and high ferroelectric characteristics.

After that, as in the first embodiment, through the respective steps in FIG. 5C, FIG. 5D, FIG. 6A, FIG. 6B, FIG. 7A, FIG. 7B, the FeRAM according to the present example is completed.

As described above, according to the third modification example, by adopting the stack-type capacitor structure to the ferroelectric capacitor structure 30, the highly reliable FeRAM reducing the occupied area of the capacitor while assuring relatively large capacitance, however capable of obtaining the same orientation as of when a planer-type capacitor structure is adopted or above in the ferroelectric film 40, and thereby capable of obtaining excellent ferroelectric characteristics is realized.

Fourth Modification Example

In the present example, a hydrogen protection film is formed at a plurality of positions in a stacked structure of a FeRAM.

FIG. 15A to FIG. 19 are schematic sectional views showing major steps out of a manufacturing method of a FeRAM according to a fourth modification example.

First, as in the first embodiment, through the step in FIG. 3A, an MOS transistor 20 functioning as a selection transistor is formed on the silicon semiconductor substrate 10.

Figure 15A:
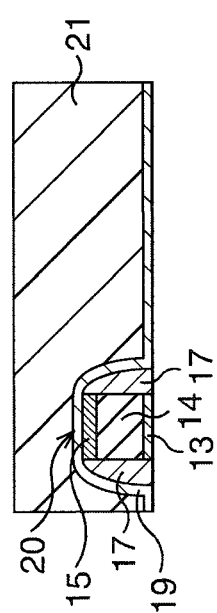
FIG. 15A is a schematic sectional view showing a major step out of a manufacturing method of a FeRAM according to a fourth modification example.

Subsequently, as shown in FIG. 15A, the interlayer insulating film 21 covering the MOS transistor 20 is formed.

Specifically, by CVD method using, for example, TEOS, a silicon oxide film is deposited to have a film thickness of about 600 nm to cover the MOS transistor 20 to thereby form the interlayer insulating film 21. After that, the surface of the interlayer insulating film 21 is planarized, for example, by CMP method, and after that, the surface of the planarized interlayer insulating film 21 is subject to an annealing process in $N_2$ atmosphere to be nitrided.

Figure 15B:
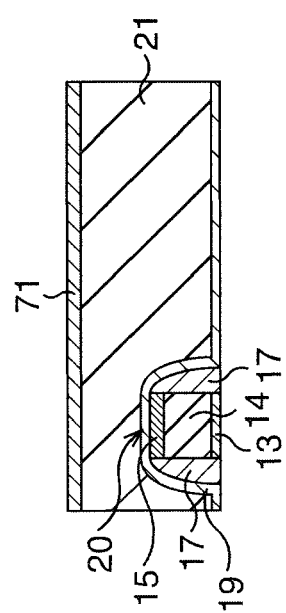
FIG. 15B is a schematic sectional view showing a major step out of the manufacturing method of the FeRAM according to the fourth modification example.

Subsequently, as shown in FIG. 15B, a hydrogen protection film 71 protecting the ferroelectric capacitor structure 30 to be formed in steps thereafter from characteristics degradation caused by hydrogen is formed.

Specifically, the hydrogen protection film 71 is formed on the interlayer insulating film 21. The hydrogen protection film 71 is, for example, to prevent the hydrogen generated from the interlayer insulating film 21 and the like in the steps thereafter from infiltrating into the ferroelectric capacitor structure 30, and is formed, for example, by sputtering method by using, for example, alumina (AlO) or SiON, SiN and the like as a material. In the case of AlO, it is formed to have a film thickness of about 20 nm to 50 nm, and in the case of SiON, it is formed to have a film thickness of about 100 nm.

Figure 15C:
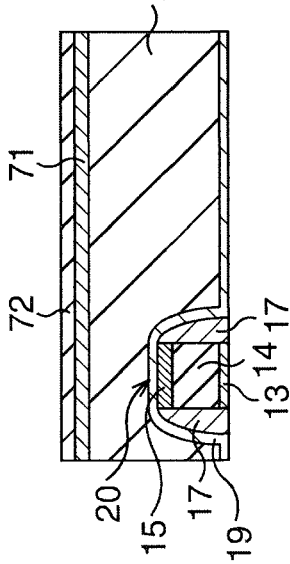
FIG. 15C is a schematic sectional view showing a major step out of the manufacturing method of the FeRAM according to the fourth modification example.

Subsequently, as shown in FIG. 15C, an interlayer insulating film 72 is formed on the hydrogen protection film 71.

Specifically, by CVD method using, for example, TEOS, a silicon oxide film is deposited on the hydrogen protection film 71 to have a film thickness of about 50 nm to thereby form the interlayer insulating film 72. After that, the surface of the interlayer insulating film 72 is subject to an annealing process in $N_2$ atmosphere to be nitrided.

Figure 15D:
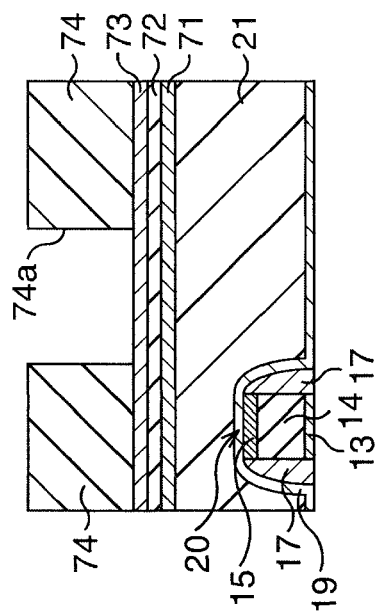
FIG. 15D is a schematic sectional view showing a major step out of the manufacturing method of the FeRAM according to the fourth modification example.

Subsequently, as shown in FIG. 15D, a resist pattern 74 is formed to process a contact hole.

Specifically, after the anti-reflection film 73 (which is possible to be omitted) is formed on the interlayer insulating film 72 by coating, a resist is formed on the anti-reflection film 73 by coating. Then, the resist is processed by lithography to form the resist pattern 74 with an opening 74a.

Figure 15E:
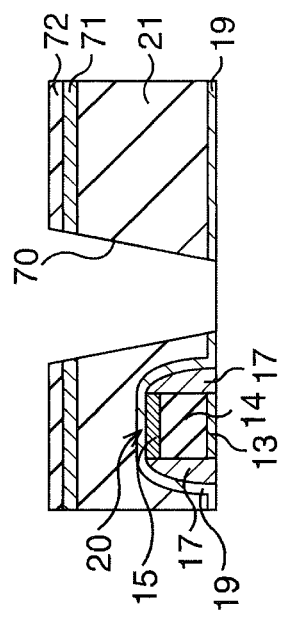
FIG. 15E is a schematic sectional view showing a major step out of the manufacturing method of the FeRAM according to the fourth modification example.

Subsequently, as shown in FIG. 15E, the interlayer insulating film 72, the hydrogen protection film 71, and the interlayer insulating film 21 are processed using the resist pattern 74.

Specifically, by using the resist pattern 74 as a mask, the interlayer insulating film 72, the hydrogen protection film 71, and the interlayer insulating film 21 are dry etched. Here, the interlayer insulating film 72 patterned by the resist pattern 74 serves as a hard mask when etching the hydrogen protection film 71 and the interlayer insulating film 72. At the same time, an anti-reflection film 73 is etched as well. In the interlayer insulating film 72, the hydrogen protection film 71, and the interlayer insulating film 21, through this dry etching, a contact hole 70 exposing a part of the surface of the source/drain region 18 is formed in a manner following the opening 74a of the resist pattern 74. After that, the resist pattern 74 and the anti-reflection film 73 thereunder are removed.

Figure 15F:
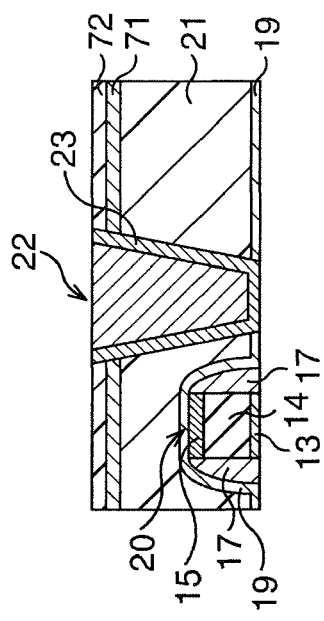
FIG. 15F is a schematic sectional view showing a major step out of the manufacturing method of the FeRAM according to the fourth modification example.

Subsequently, as shown in FIG. 15F, the W plug 22 to be a balk contact is formed. Specifically, for example, a Ti film (of a film thickness of about 30 nm) and a TiN film (of a film thickness of about 20 nm) are deposited sequentially on the interlayer insulating film 21 by sputtering method to cover a wall surface of the contact hole 70 to thereby form the base (glue) film 23.

Subsequently, a tungsten (W) film is formed by CVD method to bury the contact hole 70 therewith via the glue film 23. For example, by CMP, the W film and the glue film 23 are polished using the interlayer insulating film 21 as a stopper to form the W plug 22 being the contact hole 70 of which inside is buried with W via the glue film 23.

Figure 16A:
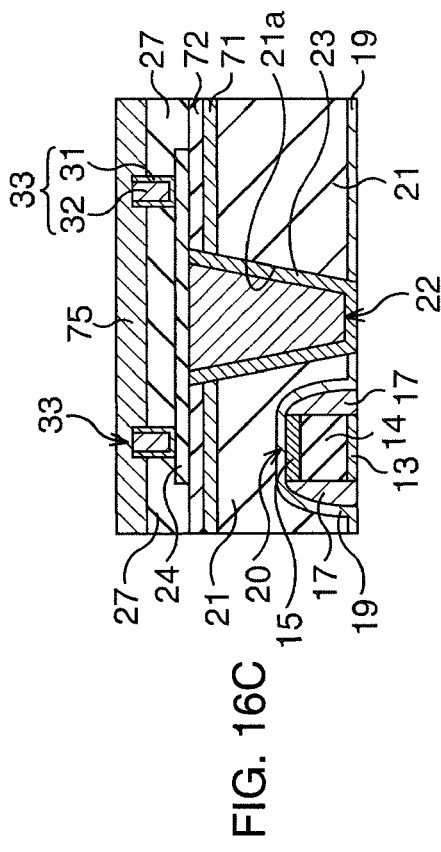
FIG. 16A is a schematic sectional view showing a major step out of the manufacturing method of the FeRAM according to the fourth modification example.

Subsequently, as in the first embodiment, through the respective steps in FIG. 3C to FIG. 3G FIG. 4A, FIG. 4B, the connecting portion 33 formed by filling the groove 27a of the interlayer insulating film 27 to be connected with the conductive film 24 is formed, as shown in FIG. 16A.

Figure 16B:
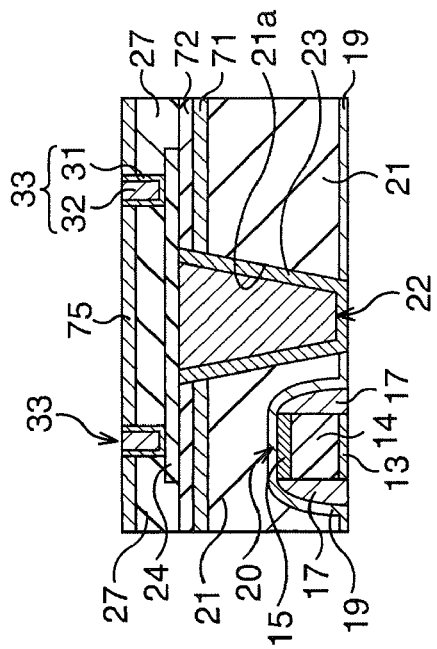
FIG. 16B is a schematic sectional view showing a major step out of the manufacturing method of the FeRAM according to the fourth modification example.

Subsequently, as shown in FIG. 16B, a part of the connecting portion 33 is exposed from the surface of the interlayer insulating film 27.

Specifically, by making use of the difference in etching rate between the interlayer insulating film 27 and the connecting portion 33, all over the surface of the interlayer insulating film 27 is subject to an anisotropic etching (etch back). At this time, for example, the surface layer of the interlayer insulating film 27 is etched so that an upper portion of the connecting portion 33 exposes in a protruding manner about 30 nm to 50 nm from the interlayer insulating film 27.

Figure 16C:
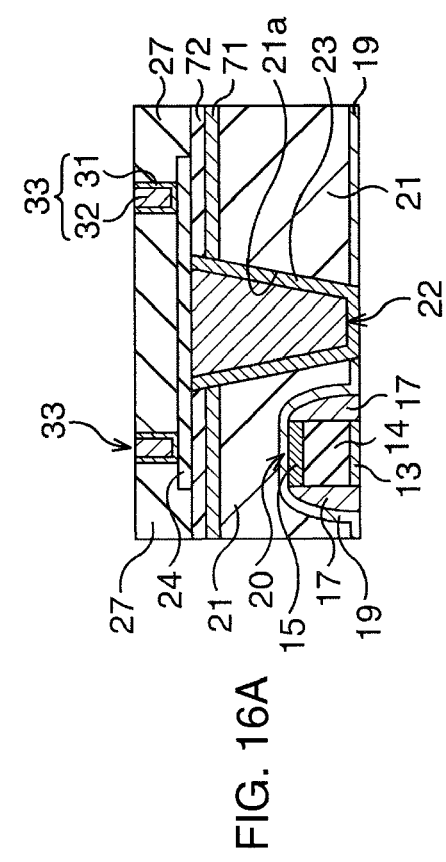
FIG. 16C is a schematic sectional view showing a major step out of the manufacturing method of the FeRAM according to the fourth modification example.

Subsequently, as shown in FIG. 16C, a hydrogen protection film 75 protecting the ferroelectric capacitor structure 30 to be formed in steps thereafter from characteristics degradation caused by hydrogen is formed.

Specifically, the hydrogen protection film 75 is formed on the interlayer insulating film 27 to cover the exposed upper portion of the connecting portion 33. The hydrogen protection film 75 is, for example, to prevent hydrogen generated from the interlayer insulating film 21 and the like in the steps thereafter from infiltrating into the ferroelectric capacitor structure 30, and formed, for example, by AlO—$TiO_2$ to have a film thickness of about 100 nm.

Figure 16D:
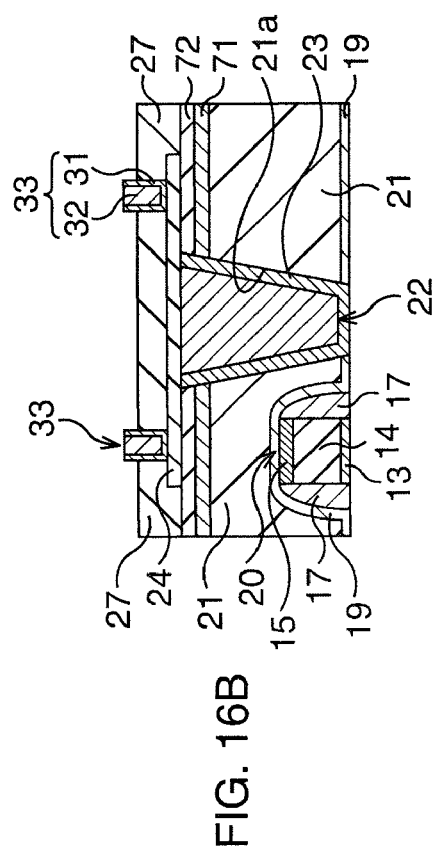
FIG. 16D is a schematic sectional view showing a major step out of the manufacturing method of the FeRAM according to the fourth modification example.

Subsequently, as shown in FIG. 16D, the surface of the connecting portion 33 is exposed by polishing the surface layer of the hydrogen protection film 75.

Specifically, for example, by CMP method, the surface layer of the hydrogen protection film 75 is polished using the connecting portion 33 as a stopper. With this, the surface of the hydrogen protection film 75 is exposed in a manner that the surface of the connecting portion 33 is exposed.

Subsequently, through the steps in FIG. 4D, FIG. 5A to FIG. 5D, the interlayer insulating film 43 is formed such that the ferroelectric capacitor structure 30 is completely covered thereby via the hydrogen protection film 42. After that, the surface of the interlayer insulating film 43 is planarized, for example, by CMP method, and after that, the surface of the planarized interlayer insulating film 43 is subject to an annealing process in $N_2$ atmosphere to be nitrided.

Figure 17A:
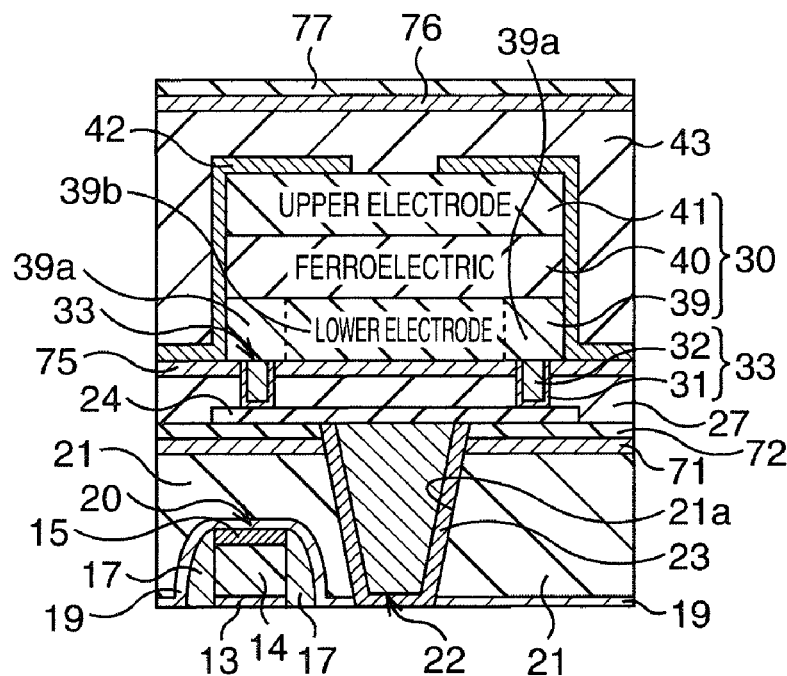
FIG. 17A is a schematic sectional view showing a major step out of the manufacturing method of the FeRAM according to the fourth modification example.

Subsequently, as shown in FIG. 17A, a hydrogen protection film 76 preventing the ferroelectric capacitor structure 30 from characteristics degradation caused by hydrogen is formed.

Specifically, the hydrogen protection film 76 is formed on the interlayer insulating film 43. The hydrogen protection film 76 is to prevent the hydrogen generated in the steps after the formation of the ferroelectric capacitor structure 30 from infiltrating into the ferroelectric capacitor structure 30 and its lower structure, and is formed, for example, by sputtering method using, for example, alumina (AlO), or SiON, SiN, or the like as a material. In the case of AlO, it is formed to have a film thickness of about 20 nm to 50 nm, and in the case of SiON, it is formed to have a film thickness of about 100 nm. After that, an interlayer insulating film 77 is formed on the hydrogen protection film 76.

Figure 17B:
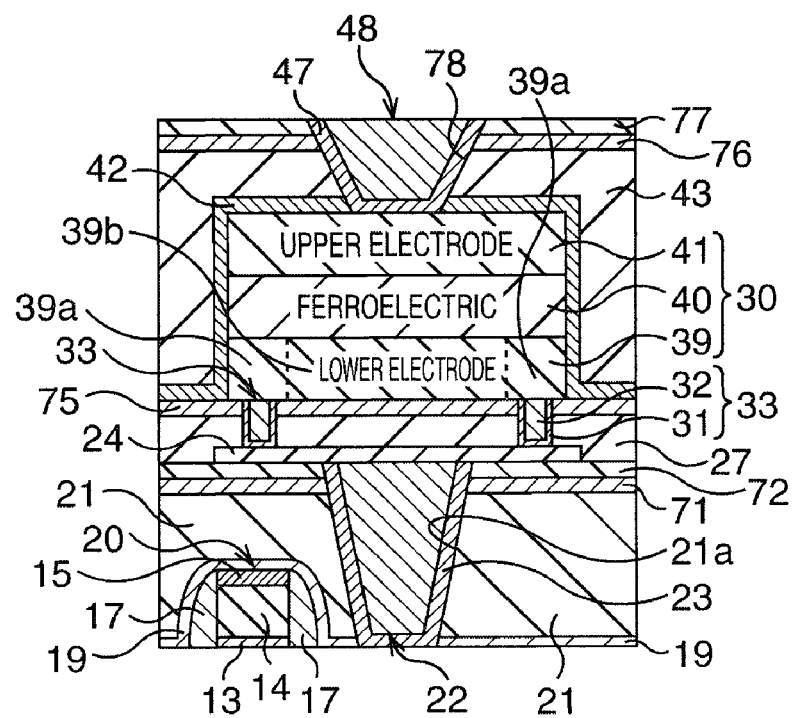
FIG. 17B is a schematic sectional view showing a major step out of the manufacturing method of the FeRAM according to the fourth modification example.

Subsequently, as shown in FIG. 17B, in the same manner as of the W plug 22, a W plug 48 is formed by burying inside a via hole 78 with W via the glue film 47.

Figure 18A:
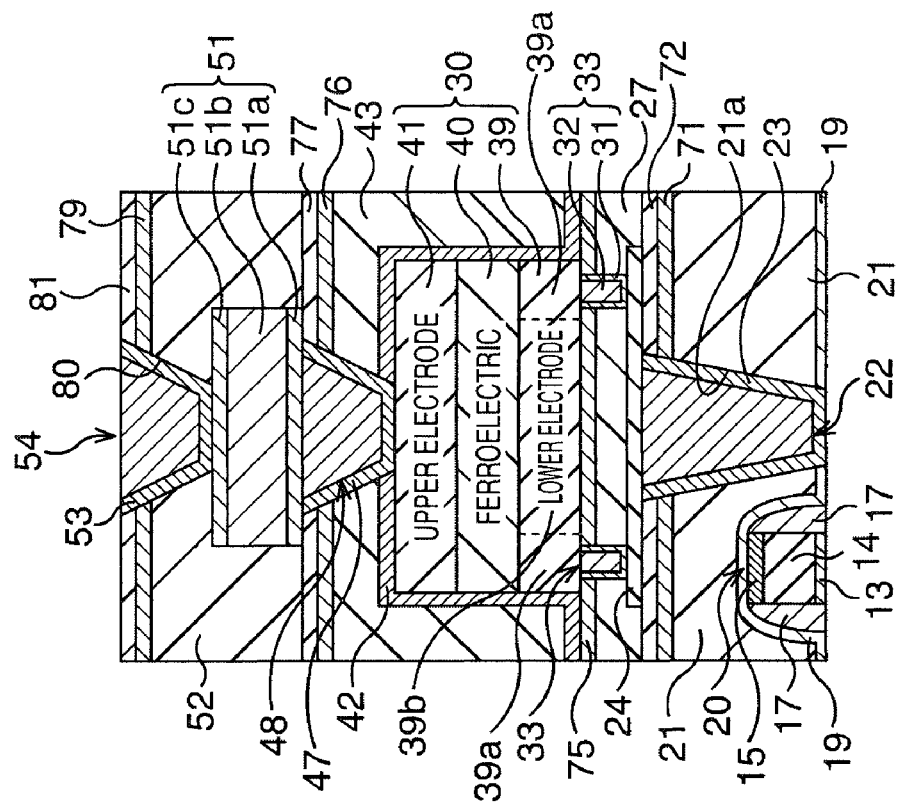
FIG. 18A is a schematic sectional view showing a major step out of the manufacturing method of the FeRAM according to the fourth modification example.

Subsequently, as shown in FIG. 18A, after the first wiring 51 and the interlayer insulating film 52 are formed as in the step in FIG. 7B in the first embodiment, a hydrogen protection film 79 to prevent the ferroelectric capacitor structure 30 from characteristics degradation caused by hydrogen is formed.

Specifically, the hydrogen protection film 79 is formed on the interlayer insulating film 52. The hydrogen protection film 79 is to prevent the hydrogen generated in the steps after the formation of the ferroelectric capacitor structure 30 from infiltrating into the ferroelectric capacitor structure 30 and its lower structure, and is formed, for example, by sputtering method using, for example, alumina (AlO) or SiON, SiN or the like as a material. In the case of AlO, it is formed to have a film thickness of about 20 nm to 50 nm, and in the case of SiON, it is formed to have a film thickness of about 100 nm. After that, an interlayer insulating film 81 is formed on the hydrogen protection film 79.

Figure 18B:
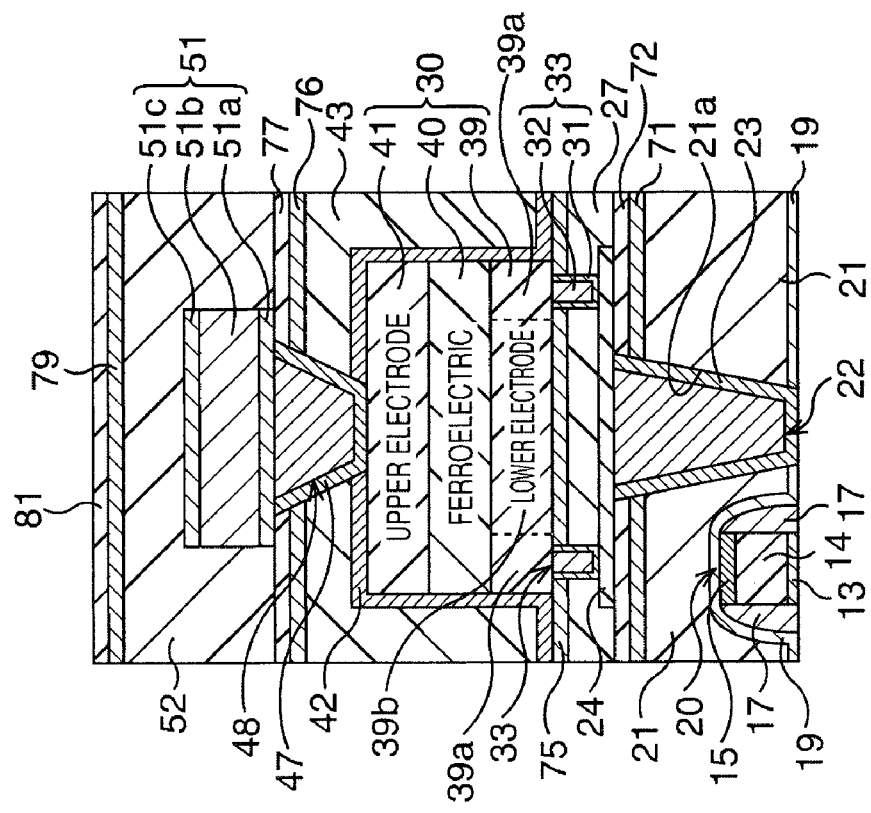
FIG. 18B is a schematic sectional view showing a major step out of the manufacturing method of the FeRAM according to the fourth modification example.

Subsequently, as shown in FIG. 18B, in the same manner as of the W plug 22, a W plug 54 is formed by burying inside a via hole 80 with W via the glue film 53.

Subsequently, as in the first embodiment, after the second wiring 55 connected to the W plug 54 is formed, further the formation of the W plug and the wiring is repeated to the extent of forming, for example, the twentieth wiring, to thereby for the multilayer wiring structure 50.

Figure 19:
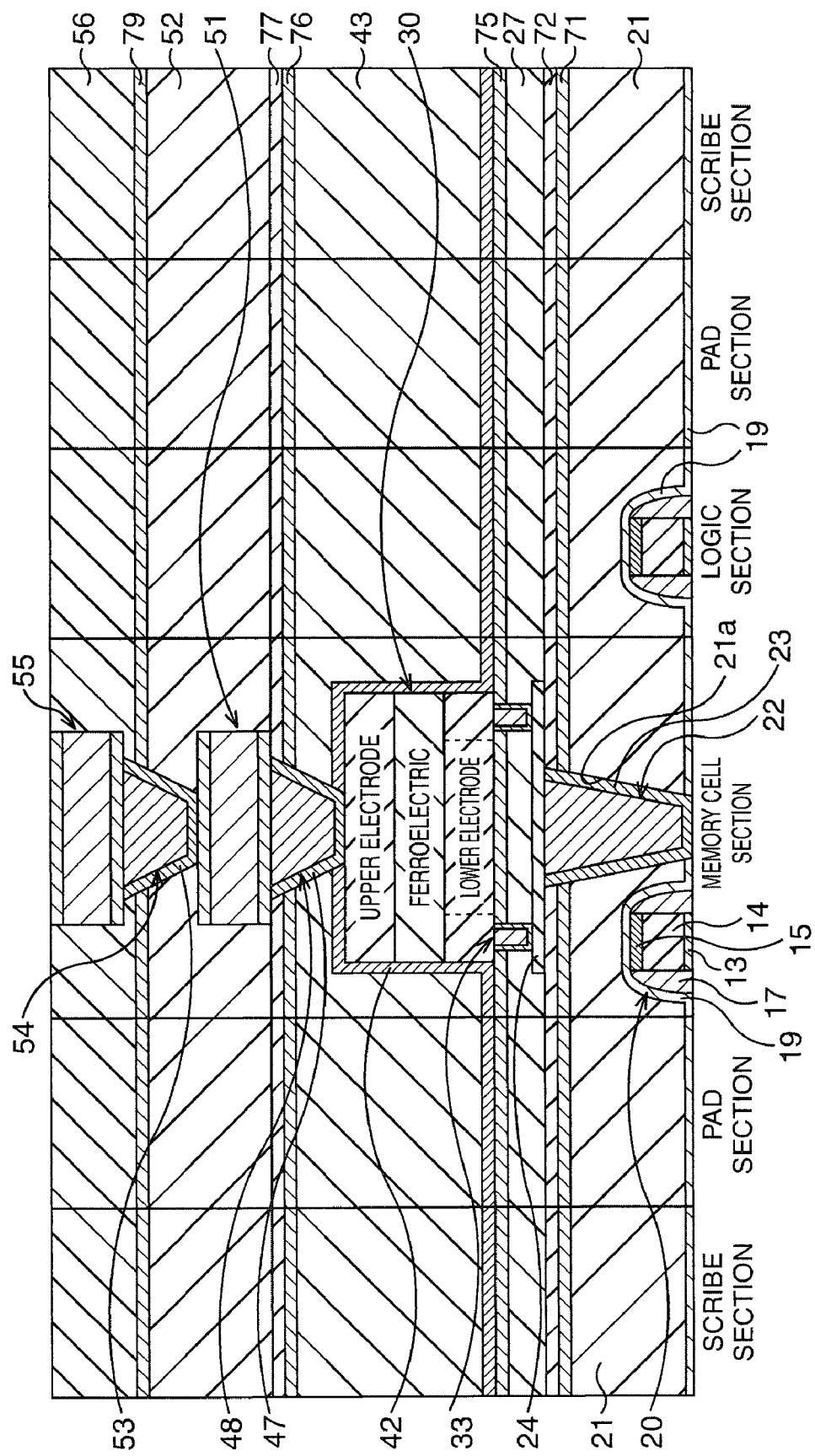
FIG. 19 is a schematic sectional view showing an appearance, in which respective hydrogen protection films are formed all over the FeRAM.

Here, in the above description, only the vicinity of the memory cell section of the FeRAM has been shown, however, in the present modification example, it is favorable that the hydrogen protection films 42, 71, 75, 76, 78 are formed all over the surface of the FeRAM. Specifically, as shown in FIG. 19, the hydrogen protection films 42, 71, 75, 76, 78 are formed all over the surface of the FeRAM over a memory cell section, a logic section composing a peripheral circuit such as a CMOS transistor or the like, a pad section formed by being provided with a drawn-out electrode, and a scribe section to cut out each semiconductor chip from the silicon semiconductor substrate 10. Based on this structure, it is possible to protect the ferroelectric capacitor structure against the infiltration of hydrogen to the maximum extent possible. Note that, for convenience of drawing, as for the logic section, the pad section and the scribe section, only the respective regions are shown, and the transistor of the logic section, the drawn-out electrode of the pad section, and the like are omitted to be drawn.

After that, as in the first embodiment, through the steps of forming the protection film, the pad electrode, and the like (not shown), the FeRAM according to the present embodiment is completed.

As described above, according to the fourth modification example, by adopting the stack-type capacitor structure for the ferroelectric capacitor structure 30, the occupied area of the capacitor is reduced while assuring relatively large capacitance, however, the ferroelectric film 40 can obtain the same high orientation as of when adopting the planar-type capacitor structure or above. In addition, by preventing hydrogen from infiltrating into the ferroelectric film 40 as much as possible, the highly reliable FeRAM capable of obtaining excellent ferroelectric characteristics is realized.

Fifth Modification Example

In the present example, a case where the connecting portion of a frame shape is formed without forming the groove in the interlayer insulating film 27, is presented as an example.

FIG. 20A to FIG. 21D are schematic sectional views showing major steps out of a manufacturing method of a FeRAM according to the fifth modification example.

First, as in the first embodiment, through the step in FIG. 3A, the MOS transistor 20 is formed on the silicon semiconductor substrate 10.

Figure 20A:
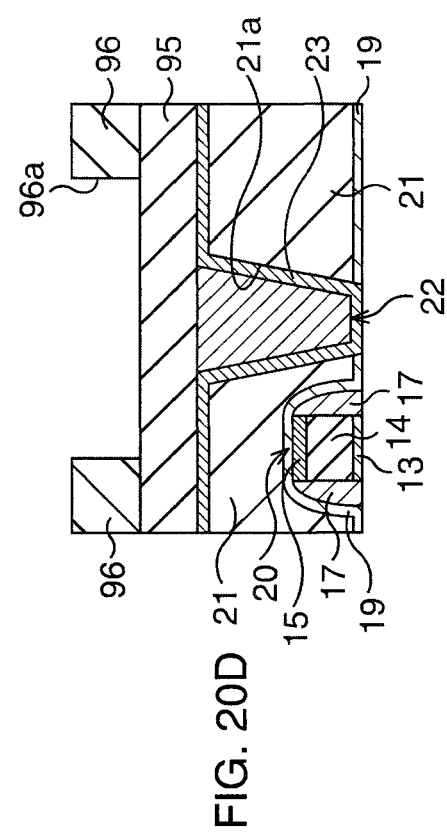
FIG. 20A is a schematic sectional view showing a major step out of a manufacturing method of a FeRAM according to a fifth modification example.

Subsequently, as shown in FIG. 20A, the interlayer insulating film 21 covering the MOS transistor 20 and a stopper film 94 are formed sequentially.

Specifically, first, the interlayer insulating film 21 is formed to cover the MOS transistor 20. Here, as an interlayer insulating film 21, a silicon oxide film is deposited to have a film thickness of about 600 nm by CVD method using, for example, TEOS. After that, the surface of the interlayer insulating film 21 is planarized, for example, by CMP method. Then, the stopper film 94 is formed on the interlayer insulating film 21 of which surface is planarized. As a stopper film 94, for example, SiON is deposited to have a film thickness of about 50 nm.

Figure 20B:
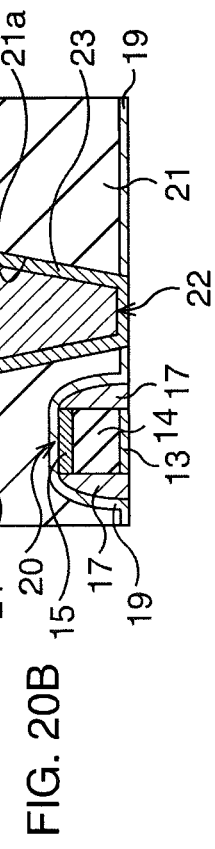
FIG. 20B is a schematic sectional view showing a major step out of the manufacturing method of the FeRAM according to the fifth modification example.

Subsequently, as shown in FIG. 20B, the W plug 22 to be a balk contact is formed.

Specifically, first, the stopper film 94, the interlayer insulating film 21 and the protection film 19 are processed to the extent that a part of the surface of the source/drain region 18 is exposed by lithography and dry etching followed to thereby form the contact hole 21a having a diameter of, for example, about 0.25 μm.

Subsequently, for example, a Ti film (of a film thickness of about 30 nm) and a TiN film (of a film thickness of about 20 nm) are deposited sequentially on the interlayer insulating film 21 by sputtering method to form a base film (glue film) 23 to cover the wall surface of the contact hole 21a.

After that, a tungsten (W) film is formed by CVD method to bury the contact hole 21a therewith via the glue film 23. For example, by CMP, the W film and the glue film 23 are polished using the stopper film 94 as a polishing stopper to thereby form the W plug 22 being the contact hole 21a of which inside is buried with W via the glue film 23.

Figure 20C:
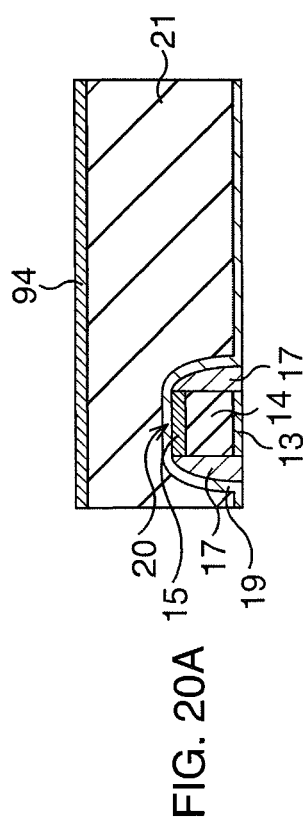
FIG. 20C is a schematic sectional view showing a major step out of the manufacturing method of the FeRAM according to the fifth modification example.

Subsequently, as shown in FIG. 20C, an interlayer insulating film 95 is formed on the stopper film 94 to cover over the W plug 22. As an interlayer insulating film 95, a silicon oxide film is deposited to have a film thickness of about 100 nm to 200 nm, for example, by CVD method.

Figure 20D:
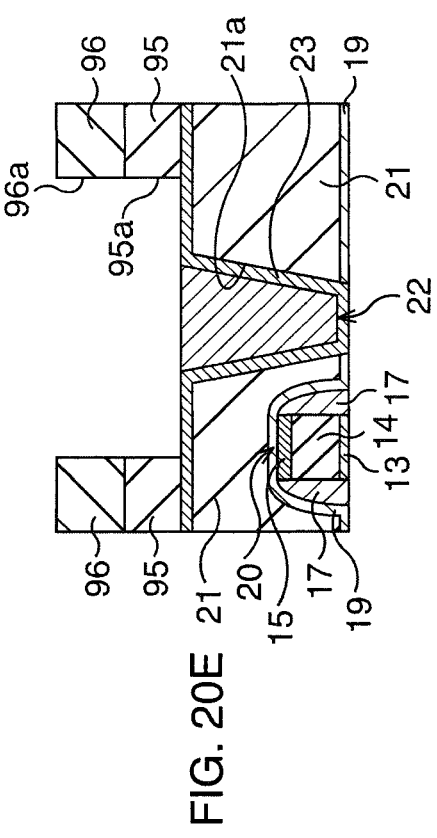
FIG. 20D is a schematic sectional view showing a major step out of the manufacturing method of the FeRAM according to the fifth modification example.

Subsequently, as shown in FIG. 20D, a resist pattern 96 to process the interlayer insulating film 95 is formed.

Specifically, after the anti-reflection film (not shown, which is possible to be omitted) is formed on the interlayer insulating film 95 by coating, a resist is formed on the anti-reflection film by coating. Then, the resist is processed by lithography to form the resist pattern 96 with an opening 96a.

Figure 20E:
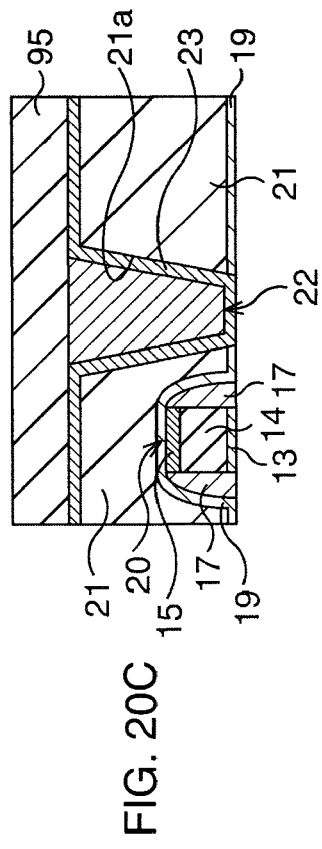
FIG. 20E is a schematic sectional view showing a major step out of the manufacturing method of the FeRAM according to the fifth modification example.

Subsequently, as shown in FIG. 20E, the interlayer insulating film 95 is processed using the resist pattern 96 to form an opening 95a.

Specifically, the interlayer insulating film 95 is dry etched using the resist pattern 96 and the stopper film 94 as a mask and an etching stopper, respectively. At the same time, the anti-reflection film is etched as well. Through this dry etching, in the interlayer insulating film 95, the opening 95a of, for example, a rectangle exposing a part of the surface of the stopper film 94 and the surface of the W plug 22 in a manner following the opening 96a of the resist pattern 96 is formed. After that, the resist pattern 96 and the anti-reflection film thereunder are removed.

Figure 21A:
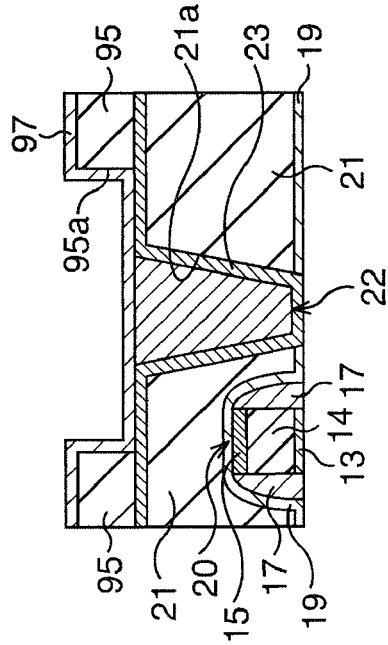
FIG. 21A is a schematic sectional view showing a major step out of the manufacturing method of the FeRAM according to the fifth modification example.

Subsequently, as shown in FIG. 21A, a conductive film 97 is formed.

Specifically, a W film is stacked on the interlayer insulating film 95 via a base (glue) film to cover an inside wall face of the opening 95a to thereby form the conductive film 97. As a glue film, TiN is formed to have a film thickness of about 20 nm. As a W film, W is formed to have a film thickness of about 80 nm.

Figure 21B:
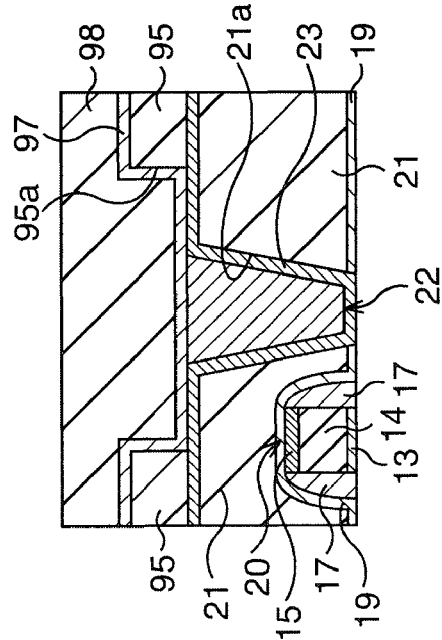
FIG. 21B is a schematic sectional view showing a major step out of the manufacturing method of the FeRAM according to the fifth modification example.

Subsequently, as shown in FIG. 21B, an interlayer insulating film 98 is formed on the conductive film 97 such that the opening 95a is buried therewith via the conductive film 97. As an interlayer insulating film 98, a silicon oxide film is deposited to have a film thickness of about 1000 nm, for example, by CVD method.

Figure 21C:
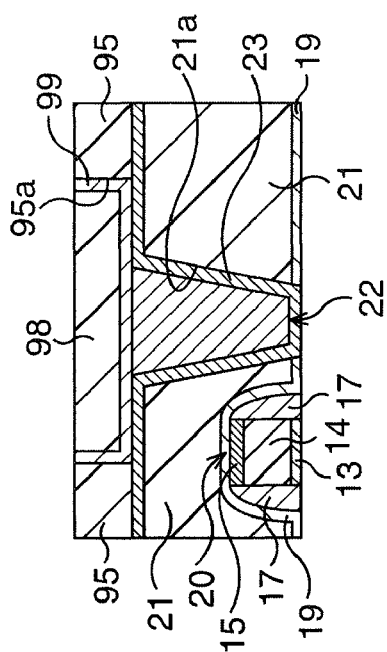
FIG. 21C is a schematic sectional view showing a major step out of the manufacturing method of the FeRAM according to the fifth modification example.

Subsequently, as shown in FIG. 21C, a connecting portion 99 is formed.

Specifically, the interlayer insulating film 98 and the conductive film 97 are polished, for example, by CMP using the interlayer insulating film 95 as a stopper. At this time, the connecting portion 99 is formed by the conductive film 97 remaining only at the portion covering the inside wall face of the opening 95a. The interlayer insulating film 98 remains in the opening 95a such that the connecting portion 99 is buried thereby. After that, through an $N_2$ annealing process at a relatively low temperature, a curing is performed with respect to the interlayer insulating films 95, 98 to thereby perform dehydration treatment thereto. Here, when the annealing process is performed at a high temperature, the surface of W being a conductive material is oxidized, hence, from a viewpoint of preventing the oxidization, an annealing process at a relatively low temperature of, for example, about 350° C. is performed for two minutes.

Figure 21D:
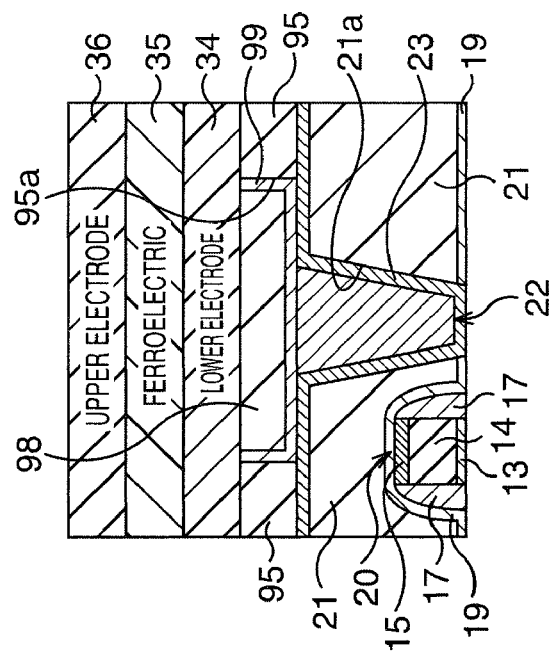
FIG. 21D is a schematic sectional view showing a major step out of the manufacturing method of the FeRAM according to the fifth modification example.

After that, as shown in FIG. 21D, after the lower electrode layer 34, the ferroelectric film 35, and the upper electrode layer 36 are formed sequentially as in FIG. 4D, through the respective steps in FIG. 5A to FIG. 5D, FIG. 6A, FIG. 6B, FIG. 7A, FIG. 7B, the FeRAM according to the present example is completed.

In the ferroelectric capacitor structure 30, the lower electrode 39 is connected by the connecting portion 99 and the portion including the peripheral region 39a of the lower electrode 39, and is connected in the peripheral region 39a in the present embodiment. Of the lower electrode 39, the central region 39b excluding the peripheral region 39a being the connected portion of the connecting portion 99 has excellent orientation without suffering the impact of the surface of the W plug 22. By inheriting the impact of the lower electrode 39, the ferroelectric film 40 has excellent orientation and high ferroelectric characteristics in the central region thereof aligned with the central region 39b excluding the peripheral region thereof aligned with the peripheral region 39a. The central region of the ferroelectric film 40 accounts for a large ratio, and even when viewed as a whole, it results to have excellent orientation and high ferroelectric characteristics.

In an approach of the first embodiment, specifically, in the approach of forming the groove 27a of a frame shape in the interlayer insulating film 27 and burying the groove 27a with W, since the size of the groove 27a is minute, there is sometimes a case where the formation thereof is not easy in general. Contrary to this, in the present example, without forming the groove in the interlayer insulating film, it is possible to define the size (in the present example, 20 nm+80 nm=about 100 nm) of a connected portion of the connecting portion 99 with the lower electrode 39 by the film thickness of the conductive film 97, so that the connecting portion 99 with the connected portion of a very minute size can be formed easily and surely.

As described above, according to the fifth modification example, by adopting the stack-type capacitor structure for the ferroelectric capacitor structure 30, the highly reliable FeRAM reducing the occupied area of the capacitor while assuring relatively large capacitance, however capable of obtaining the same high orientation as of when a planer-type capacitor structure is adopted or above in the ferroelectric film 40, and thereby capable of obtaining excellent ferroelectric characteristics is realized.

Second Embodiment

In the present embodiment, as in the first embodiment, a structure of a FeRAM and a manufacturing method thereof will be disclosed, which are different in an aspect of a connecting portion. Note that, the same components and the like as those disclosed in the first embodiment will be denoted by the same numerical references and omitted to be described in detail.

FIG. 22A to FIG. 22D are schematic sectional views showing major steps out of the manufacturing method of the FeRAM according to the second embodiment.

First, as in the first embodiment, through the respective steps in FIG. 3A to FIG. 3F, above the silicon semiconductor substrate 10, the interlayer insulating film 27 is formed on the interlayer insulating film 21 such that the conductive film 24 is buried therein.

Figure 22A:
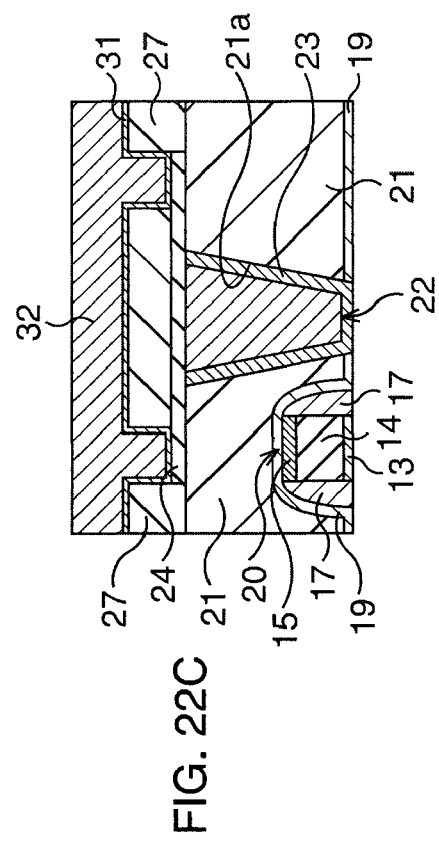
FIG. 22A is a schematic sectional view showing a major step out of a manufacturing method of a FeRAM according to a second embodiment.

Subsequently, as shown in FIG. 22A, a resist pattern 82 to form openings in the interlayer insulating film 27 is formed.

Specifically, after the anti-reflection film 28 (which is possible to be omitted) is formed on the interlayer insulating film 27 by coating, a resist is formed on the anti-reflection film 28 by coating. Then, the resist is processed by lithography to form the resist pattern 82 with respective four openings 82a aligned with four corner positions of the peripheral region of the conductive film 24. In the present embodiment, in order to cope with further microfabrication of the ferroelectric capacitor structure, in which the formation of the connecting portion in the peripheral region of the lower electrode becomes difficult, the respective openings 82a of the resist pattern 82 are formed to have a larger size as compared with the respective openings 61a of the resist pattern 61 in the first modification example of the first embodiment.

Figure 22B:
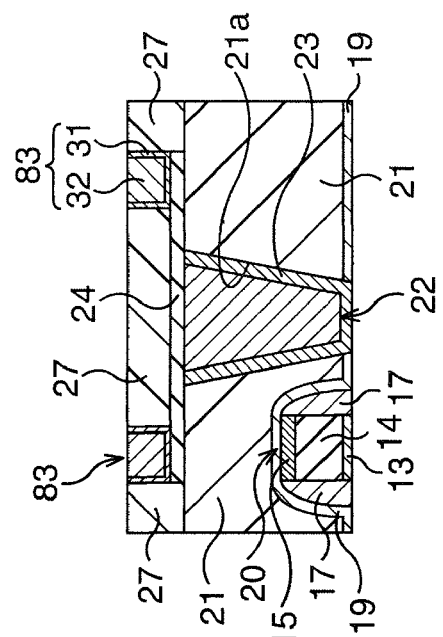
FIG. 22B is a schematic sectional view showing a major step out of the manufacturing method of the FeRAM according to the second embodiment.

Subsequently, as shown in FIG. 22B, the interlayer insulating film 27 is processed using the resist pattern 82.

Figure 23A:
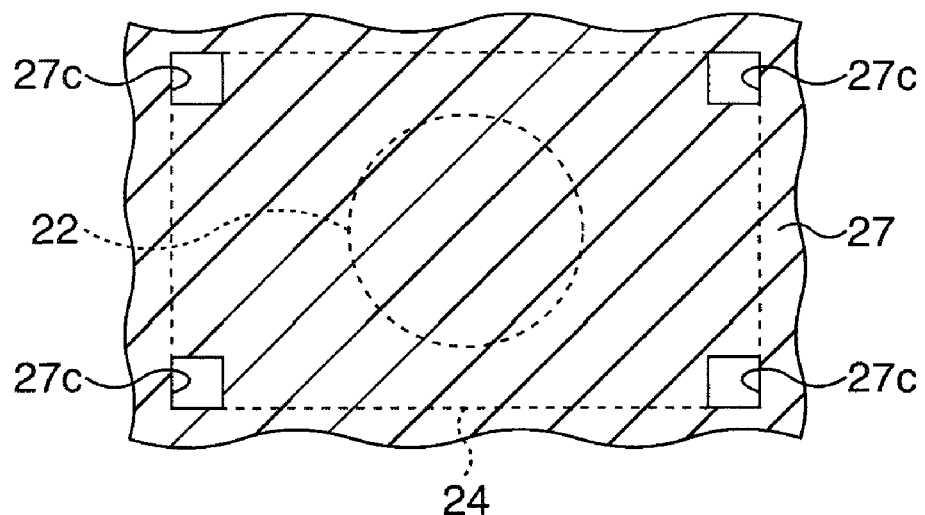
FIG. 23A is a schematic plan view showing holes formed in an interlayer insulating film.

Specifically, the interlayer insulating film 27 is dry etched using the resist pattern 82 as a mask. At the same time, the anti-reflection film 28 is etched as well. In the interlayer insulating film 27, through this dry etching, respective openings 27c exposing parts of the end portion of the conductive film 24 are formed in a manner following the respective openings 82a of the resist pattern 82. An appearance of the respective openings 27c formed in the interlayer insulating film 27 is shown in plan view in FIG. 23A. The respective openings 27c have a size larger than that of the opening 27b of the first modification example of the first embodiment, therefore, it is possible to form the respective openings 27c relatively easily with respect to a further microfabricated ferroelectric capacitor structure. After this dry etching, the resist pattern 82 and the anti-reflection film 28 thereunder are removed.

Figure 22C:
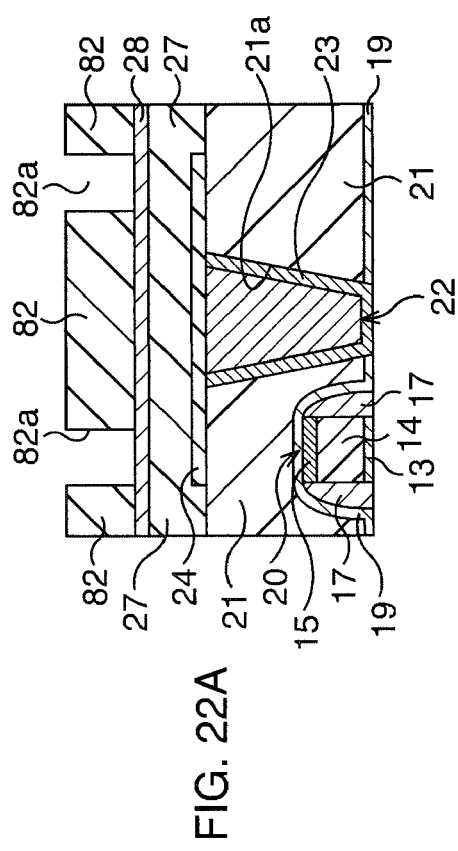
FIG. 22C is a schematic sectional view showing a major step out of the manufacturing method of the FeRAM according to the second embodiment.

Subsequently, as shown in FIG. 22C, the conductive material 32 is deposited such that the respective openings 27c are buried therewith.

Specifically, first, for example, TiN is deposited by sputtering method on the interlayer insulating film 27 to have a film thickness of about 20 nm to cover wall surfaces of the respective openings 27c to thereby form the base film (glue film) 31. Subsequently, the conductive material 32 is deposited by MOCVD method such that the respective openings 27c are buried therewith via the glue film 31. As a conductive material 32, here, Iridium (Ir) being a precious metal is formed to have a film thickness of about 400 nm to 600 nm or TiAlN being a conductive nitride film is formed to have a film thickness of about 400 nm to 600 nm. Further, as a conductive material 32, platinum (pt) is also applicable (a slightly generous amount of platinum is used for the formation due to the larger diameter of the openings).

Figure 22D:
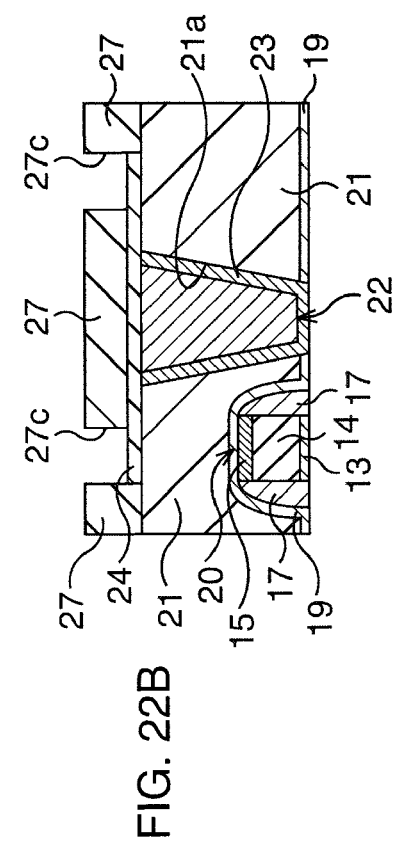
FIG. 22D is a schematic sectional view showing a major step out of the manufacturing method of the FeRAM according to the second embodiment.

Subsequently, as shown in FIG. 22D, connecting portions 83 are formed.

Figure 23B:
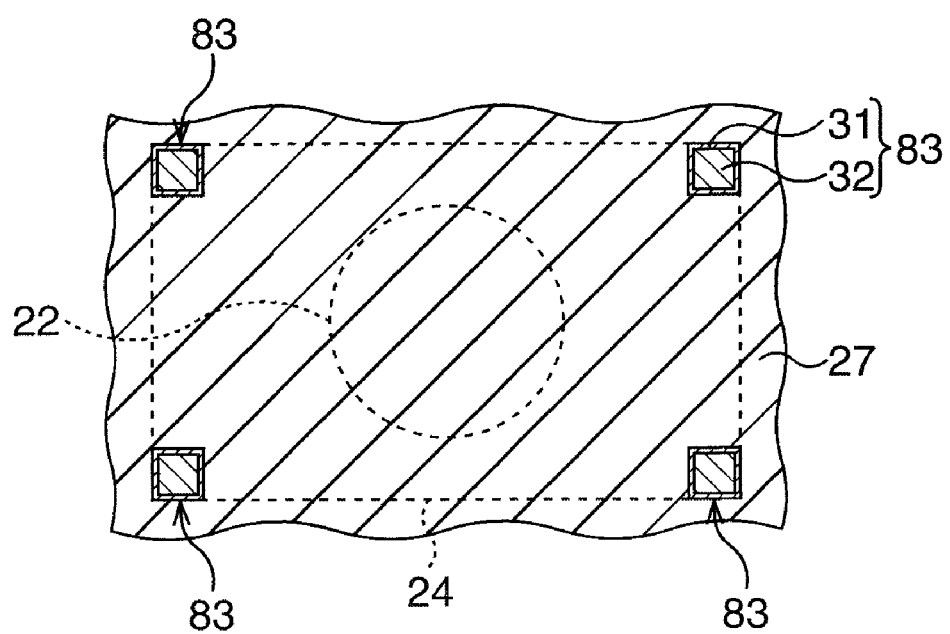
FIG. 23B is a schematic plan view showing connecting portions formed in the holes formed in the interlayer insulating film.

Specifically, the conductive material 32 and the glue film 31 are polished, for example, by CMP using the interlayer insulating film 27 as a stopper to form the respective connecting portions 83 each having a plug shape being the respective openings 27c of which insides are buried with the conductive material 32 via the glue film 31. An appearance of the respective connecting portions 83 formed in the respective openings 27c are shown in plan view in FIG. 23B.

Subsequently, through an annealing process, a curing is performed with respect to the interlayer insulating film 27 to thereby perform dehydration treatment thereto. In the present example, it is possible to perform the annealing process at a high temperature. Specifically, when Ir is used for the conductive material 32, even when the surface layer of the connecting portion 83 is oxidized to generate $IrO_2$, since $IrO_2$ is a conductive oxide, the connecting portion 83 can maintain favorable conductivity. Meanwhile, in the case where TiAlN is used for a conductive material 32, since TiAlN is a conductive nitride having excellent oxidation resistance, the connecting portion 83 can keep favorable conductivity. In the present example, the annealing process is performed under the conditions of a relatively high temperature at 400° C. for two minutes, using for example, $N_2$ gas.

Subsequently, as in the first embodiment, through the respective steps in FIG. 4D, FIG. 5A, FIG. 5B, the ferroelectric capacitor structure 30 is formed.

In the ferroelectric capacitor structure 30, the lower electrode 39 is connected at a portion including the connecting portions 83 and the peripheral region 39a of the lower electrode 39, and in the present embodiment, since the surfaces of the connecting portions 83 are relatively large, it is connected over in and out of the lower electrode 39 by including a part of the peripheral region 39a (so that parts of the connecting portions 83 protrude from the lower electrode 39, in other words). Of the lower electrode 39, the central region 39b excluding the peripheral region 39a being the connected portion of the connecting portions 83 has excellent orientation without suffering the impact of the surface of the W plug 22. By inheriting the impact of the lower electrode 39, the ferroelectric film 40 has excellent orientation and high ferroelectric characteristics in the central region thereof aligned with the central region 39b excluding the peripheral region thereof aligned with the peripheral region 39a. The central region of the ferroelectric film 40 accounts for a large ratio, and even when viewed as a whole, it results to have excellent orientation and high ferroelectric characteristics.

Figure 24A:
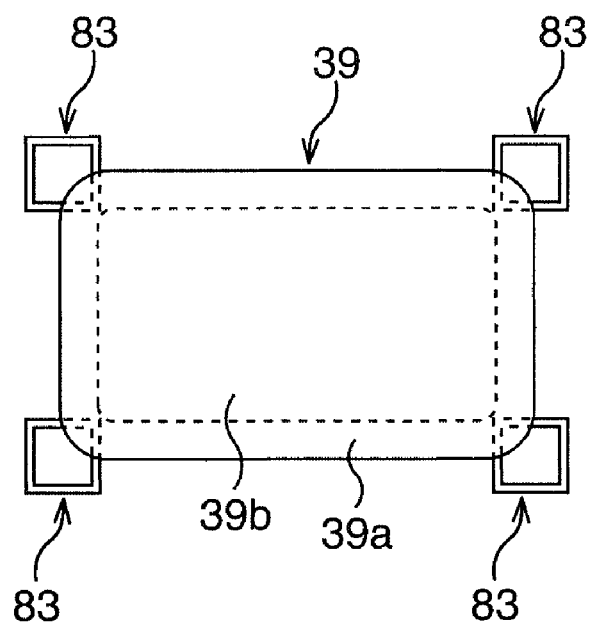
FIG. 24A is a schematic plan view showing an ideal connected state of the lower electrode and the respective connecting portions.
Figure 24B:
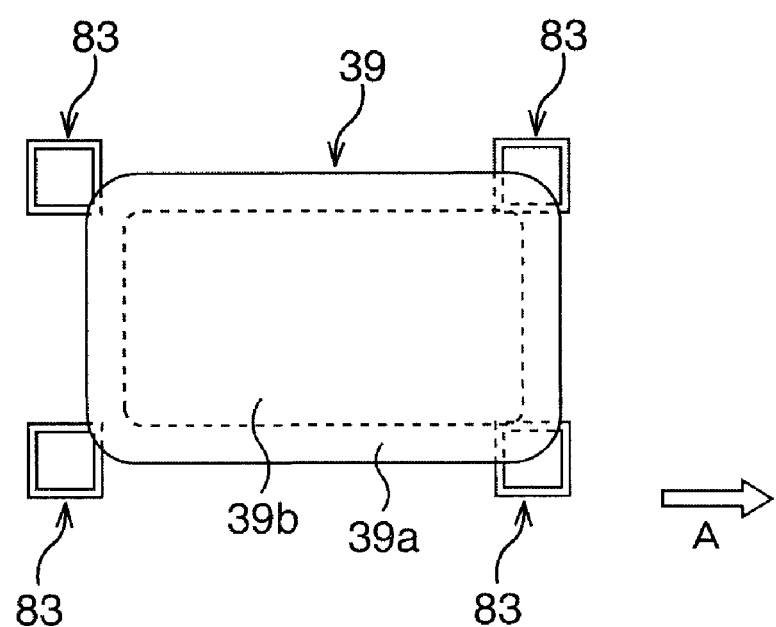
FIG. 24B is a schematic plan view showing a case where the lower electrode is formed at a position slightly shifted in the direction of an arrow A.
Figure 25:
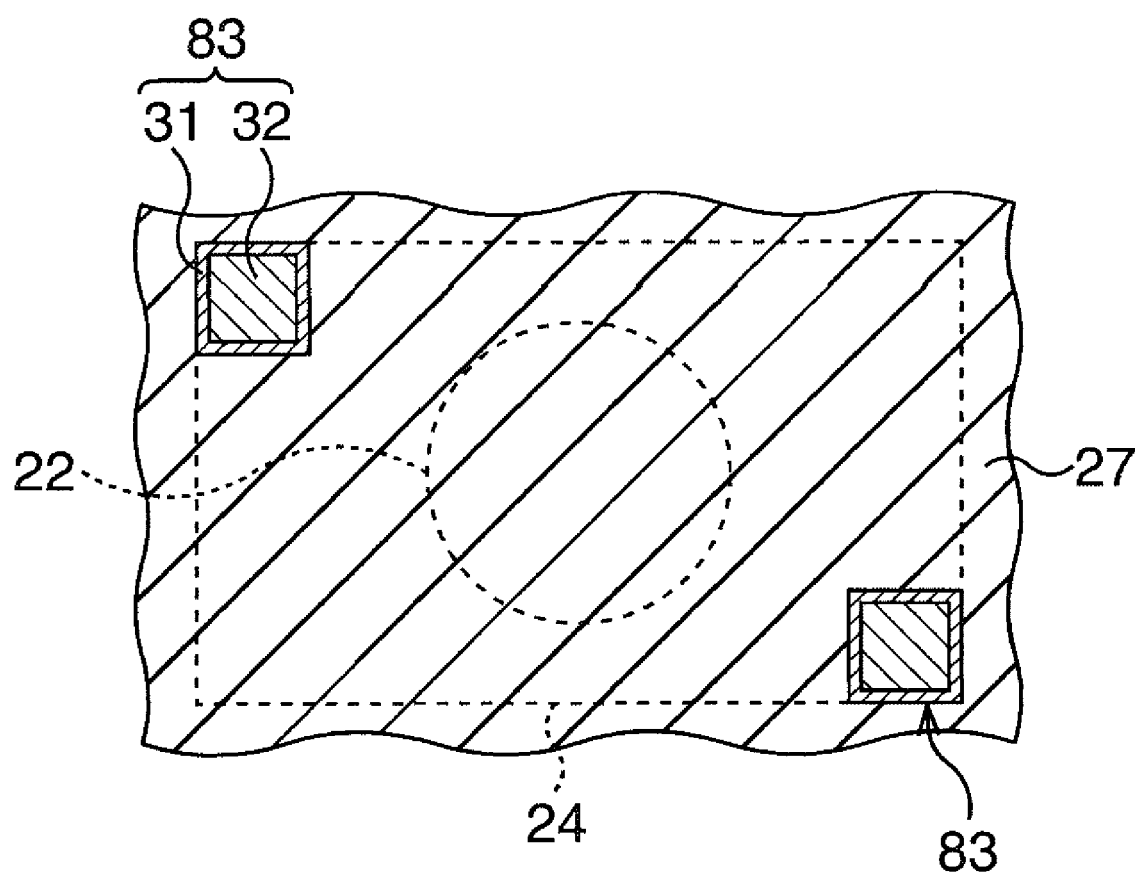
FIG. 25 is a schematic plan view showing an appearance in which the respective connecting portions are formed at two cornered positions facing each other in a peripheral region of a conductive film.

Further, in the present embodiment, the connecting portion 83 has a relatively large size and formed over in and out of the lower electrode 39 by including the part of the peripheral region 39a, so that the positioning margin when forming the lower electrode 39 can be set largely. Specifically, when the ferroelectric capacitor structure 30 including the lower electrode 39 is formed by patterning, it is ideal that the lower electrode 39 and the respective connecting portions 83 are connected in a manner as shown in FIG. 24A. In that case, as for the four connecting portions 83, a connected state, in which the four connecting portions 83 are connected equivalently over in and out of the lower electrode 39 by including a part of the peripheral region 39a, is realized. Here, for example, as shown in FIG. 24B, even when the formed position of the lower electrode 39 is slightly shifted in the direction of, for example, an arrow A, the lower electrode 39 and the connecting portions 83 can be connected stably without causing connection failure.

Subsequently, as in the first embodiment, through the respective steps in FIG. 5C and FIG. 6A, 6B, after the via hole 46 is formed in the interlayer insulating film 43 and the hydrogen protection film 42, an annealing process is performed to recover damage(s) suffered by the ferroelectric film 40 in the steps in and after the formation of the ferroelectric capacitor structure 30.

Through this annealing process, Pb departs from the peripheral region of the ferroelectric film 40 to lower the Pb concentration level in the peripheral region, and thereby ferroelectric characteristics inevitably degrade in the peripheral region of the ferroelectric film 40. Further, since the connecting portion 83 is formed to partially protrude from the lower electrode 39, when the conductive material 32 of the connecting portion 83 is one having a nature losing conductivity by oxidization, a problem arises. In this regard, in the present embodiment, since $IrO_2$ is a conductive oxide and TiAlN is a conductive nitride, exhibiting excellent oxidation resistance, the connecting portions 83 are prevented from degrading in electrical connection. Accordingly, the annealing process can be performed without concerning about the degradation in electrical connection of the connecting portions 83.

After that, as in the first embodiment, through the respective steps in FIGS. 7A, 7B, the FeRAM according to the present embodiment is completed.

Note that it is acceptable that the respective connecting portions 83 are formed at two facing corner positions in the peripheral region of the conductive film 24 as shown in FIG.

25 instead of forming the respective four connecting portions 83. In that case, by way of forming the respective connecting portions 83 to have a slightly larger size, respectively, as compared to those of the respective connecting portions 83 in FIG. 22A, the connectivity between the connecting portions 83 and the lower electrode 39 can be improved.

Further, in the present embodiment, the case where the connecting portions 83 each having a plug shape are formed is presented as an example, whereas the connecting portion of a frame shape formed over in and out of the lower electrode 39 including a part of the peripheral region 39a is also acceptable.

As described above, according to the present embodiment, by adopting the stack-type capacitor structure for the ferroelectric capacitor structure 30, the highly reliable FeRAM reducing the occupied area of the capacitor while assuring relatively large capacitance, however capable of obtaining the same high orientation as of when a planer-type capacitor structure is adopted or above in the ferroelectric film 40 easily, and thereby capable of obtaining excellent ferroelectric characteristics is realized.

INDUSTRIAL APPLICABILITY

According to the present embodiment, by adopting the stack-type capacitor structure for the ferroelectric capacitor structure 30, the highly reliable FeRAM reducing the occupied area of the capacitor while assuring relatively large capacitance, however capable of realizing the same orientation as of when a planer-type capacitor structure is adopted or above in the ferroelectric film 40, and thereby capable of obtaining excellent ferroelectric characteristics is realized.

What is claimed is:

1. A semiconductor device comprising:
   a semiconductor substrate;
   a conductive plug formed above the semiconductor substrate;
   a capacitor structure formed at a portion aligned with above the conductive plug by sandwiching a ferroelectric film having ferroelectric characteristics between a lower electrode and an upper electrode;
   an interlayer insulating film formed between the conductive plug and the capacitor structure;
   a conductive film which is formed to cover an upper surface of the conductive plug and has a longer width than a width of the lower electrode in cross-sectional view; and
   a connecting portion, formed in the interlayer insulating film, for electrically connecting the conductive plug and the lower electrode via the conductive film,
   wherein the connecting portion is located in a peripheral region of the lower electrode in plan view.

2. The semiconductor device according to claim 1, wherein a surface at the lower electrode side of the interlayer insulating film is planarized.

3. The semiconductor device according to claim 1, wherein the connecting portion is formed by a conductive material containing, at least, tungsten or copper.

4. The semiconductor device according to claim 1, wherein the connecting portion is formed at a position over in and out of the lower electrode including the peripheral region of the lower electrode in plan view.

5. The semiconductor device according to claim 4, wherein the connecting portion is formed by a conductive material containing, at least, Titanium-Aluminum-Nitrogen or a precious metal.

6. The semiconductor device according to claim 1, wherein the connecting portion is formed to have a frame shape.

7. The semiconductor device according to claim 1, wherein the connecting portion is formed into plural connecting portions each have a plug shape.

8. A semiconductor device comprising: a semiconductor substrate; a conductive plug formed above the semiconductor substrate; a capacitor structure formed at a portion aligned with above the conductive plug by sandwiching a ferroelectric film having ferroelectric characteristics between a lower electrode and an upper electrode; an interlayer insulating film formed between the conductive plug and the capacitor structure; a conductive film which is formed to cover an upper surface of the conductive plug and has a longer width than a width of the lower electrode in cross-sectional view; and a connecting portion, formed in the interlayer insulating film, for electrically connecting the conductive plug and the lower electrode via the conductive film, wherein the connecting portion is located in a peripheral region of the lower electrode in plan view, wherein the ferroelectric film has a high orientation at a first portion corresponding to an inside portion from the connecting portion, and a lower orientation at a second portion corresponding to a portion above the connecting portion as compared to the orientation at the first portion, in plan view.

9. The semiconductor device according to claim 8, wherein the ferroelectric film has a highest lead content at a central portion thereof and a lowest lead content at its most outer peripheral portion in plan view, indicating a distribution of gradually lowering lead content from the central portion toward the most outer peripheral portion.

10. The semiconductor device according to claim 8, wherein the ferroelectric film has a highest oxygen content at a central portion thereof and a lowest oxygen content at its most outer peripheral portion in plan view, indicating a distribution of gradually lowering oxygen content from the central portion toward the most outer peripheral portion.

* * * * *